(12) United States Patent
Hassner et al.

(10) Patent No.: US 12,300,295 B2
(45) Date of Patent: May 13, 2025

(54) SECURE WEAR LEVELLING OF NON-VOLATILE MEMORY BASED ON GALOIS FIELD CIRCUIT

(71) Applicant: SanDisk Technologies LLC, Addison, TX (US)

(72) Inventors: Martin Hassner, Mountain View, CA (US); Mark Branstad, Rochester, MN (US)

(73) Assignee: Sandisk Technologies, Inc., Milpitas, CA (US)

( * ) Notice: Subject to any disclaimer, the term of this patent is extended or adjusted under 35 U.S.C. 154(b) by 397 days.

(21) Appl. No.: 17/842,329

(22) Filed: Jun. 16, 2022

(65) Prior Publication Data

US 2023/0410867 A1 Dec. 21, 2023

(51) Int. Cl.
*G11C 11/16* (2006.01)
*G06F 12/14* (2006.01)

(52) U.S. Cl.
CPC ...... *G11C 11/1657* (2013.01); *G06F 12/1408* (2013.01); *G11C 11/1673* (2013.01); *G11C 11/1675* (2013.01); *G11C 11/1677* (2013.01); *G06F 2212/7211* (2013.01)

(58) Field of Classification Search
CPC ............ G11C 11/1657; G11C 11/1673; G11C 11/1675; G11C 11/1677
USPC ........................................................ 365/171
See application file for complete search history.

(56) References Cited

U.S. PATENT DOCUMENTS

| 8,356,153 B2 | 1/2013 | Franceschini et al. | |
| 2015/0019878 A1* | 1/2015 | Gammel | G06F 12/10 |
| | | | 713/190 |
| 2015/0169472 A1* | 6/2015 | Yap | G06F 12/1408 |
| | | | 713/190 |
| 2018/0300261 A1* | 10/2018 | Narayanasamy | G06F 13/16 |
| 2019/0171583 A1* | 6/2019 | Gammel | G06F 12/10 |
| 2023/0068302 A1* | 3/2023 | Jang | H04L 9/0637 |

OTHER PUBLICATIONS

Lee, Dayeol, et al., "An Off-Chip Attach on Hardware Enclaves via the Memory Bus," In proceedings of the 29th USENIX Security Symposium, Dec. 2019, 18 pages.

* cited by examiner

*Primary Examiner* — Sung Il Cho
(74) *Attorney, Agent, or Firm* — Pearl Cohen Zedek Latzer Baratz LLP

(57) ABSTRACT

Wear levelling techniques based on use of a Galois field for the logical to physical translation of data addresses for a non-volatile memory, such as an MRAM-based memory, are presented. This not only provides a wear levelling technique to extend memory life, but also adds an additional layer of security to the stored memory data. More specifically, the following presents embodiments for secure wear levelling based on a Galois field having an order based on the size of the memory. To further improve security, a randomly generated rotation of the logically address based on the Galois field can also be used.

19 Claims, 29 Drawing Sheets

T12:=

$$\begin{pmatrix} 0 & 0 & 0 & 0 & 0 & 1 & 0 & 1 & 0 & 0 & 1 & 1 \\ 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 1 & 0 \end{pmatrix}$$

T37:=T12^37, Random Rotation Matrix [stored in Memory]

```
+0  1  0  0  0  0  0  1  1  1  1  0  1  1  1+
 1  0  1  0  0  0  0  0  1  0  0  0  1  1  0
 1  0  1  0  1  0  0  0  0  1  0  0  0  1  1
 1  1  0  1  0  1  0  0  1  0  1  1  1  0  1
 1  1  0  1  1  0  1  0  0  0  1  1  1  1  1
 0  1  1  0  1  1  0  1  1  1  1  1  0  1  0
 1  0  1  0  1  1  1  0  1  0  1  0  0  0  1
 0  1  0  1  1  1  0  0  0  1  0  1  1  1  1
 1  1  0  1  0  0  1  1  0  0  0  1  1  0  1
 0  1  1  1  1  1  0  1  1  0  1  1  0  1  0
 0  1  0  0  1  0  1  1  1  1  1  0  0  1  1
 1  0  1  1  0  1  1  0  1  1  0  1  1  0  0
 0  1  0  0  1  1  0  1  0  0  0  1  0  0  1
 1  0  1  0  0  1  0  1  1  1  1  0  1  0  1
+0  1  0  0  1  1  1  0  0  0  1  1  0  1  0+
```

Input Address:          b12:=[0 1 0 0 0 0 0 1 0 0 1 0]
Randomly T^37-Rotated Address: b12*T37:=[1 0 0 1 1 0 0 1 0 0 1 1 0]

Figure 18

---Vector "b12" Multiplication by General Matrix "I12"
b12:=[[b1,b2,b3,b4,b5,b6,b7,b8,b9,b10,b11,b12]]
o12:=mb12*I12

---12-Equations o1:= b9 i97 + b8 i85 + b7 i73 + b6 i61 + b5 i49 + b4 i37 + b3 i25 + b12 i133+
o2:= b2 i13 + b11 i121 + b10 i109 + b6 i62 + b5 i50 + b4 i38 + b3 i26 + b1 i2+
o3:= b9 i98 + b8 i86 + b7 i74 + b11 i122 + b10 i110 + b4 i39 + b1 i3 + b3 i27+
o4:= b2 i14 + b8 i187 + b7 i75 + b6 i63 + b10 i111 + b1 i4 + b3 i28 + b2 i16+
o5:= b12 i136 + b11 i124 + b10 i112 + b5 i152 + b5 i15 + b4 i41 + b3 i29 + b2 i17 +
o6:= b8 i189 + b7 i177 + b6 i165 + b5 i153 + b9 i101 + b4 i42 + b3 i30 + b2 i18 +
o7:= b12 i138 + b7 i178 + b6 i166 + b1 i16 + b5 i154 + b4 i43 + b3 i31 + b2 i19 +
o8:= b12 i139 + b7 i179 + b1 i17 + b10 i114 + b5 i155 + b4 i44 + b3 i32 + b2 i20 +
o9:= b8 i191 + b7 i180 + b1 i18 + b10 i115 + b5 i156 + b4 i45 + b3 i33 + b2 i21+
o10:= b8 i194 + b7 i182 + b11 i129 + b6 i169 + b9 i105 + b1 i57 + b3 i34 + b12 i142+
o11:= b11 i130 + b7 i183 + b10 i118 + b9 i106 + b1 i10 + b4 i146 + b2 i122 + b12 i143+
o12:= b11 i131 + b7 i184 + b6 i172 + b5 i159 + b9 i107 + b4 i147 + b2 i123 + b12 i144+

Figure 19 invT12:=

|   | 0 | 0 | 0 | 0 | 0 | 0 | 0 | 0 | 0 | 0 | 1 |   |
|---|---|---|---|---|---|---|---|---|---|---|---|---|
| 0 | 0 | 0 | 0 | 0 | 0 | 0 | 0 | 0 | 0 | 1 | 0 | 0 |
| 0 | 0 | 0 | 0 | 0 | 0 | 0 | 0 | 0 | 1 | 0 | 0 | 0 |
| 0 | 0 | 0 | 0 | 0 | 0 | 0 | 0 | 1 | 0 | 0 | 0 | 1 |
| 0 | 0 | 0 | 0 | 0 | 0 | 0 | 1 | 0 | 0 | 0 | 0 | 0 |
| 0 | 0 | 0 | 0 | 0 | 0 | 1 | 0 | 0 | 0 | 0 | 0 | 1 |
| 0 | 0 | 0 | 0 | 0 | 1 | 0 | 0 | 0 | 0 | 0 | 0 | 0 |
| 0 | 0 | 0 | 0 | 1 | 0 | 0 | 0 | 0 | 0 | 0 | 0 | 0 |
| 0 | 0 | 0 | 1 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 |
|   | 0 | 0 | 0 | 0 | 0 | 0 | 0 | 0 | 0 | 0 | 1 |   |

SECURE WEAR LEVELLING OF NON-VOLATILE MEMORY BASED ON GALOIS FIELD CIRCUIT

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that use electronic charges to store data. Generally, MRAM includes a large number of magnetic memory cells formed on a semiconductor substrate, where each memory cell represents (at least) one bit of data. A bit of data is written to a memory cell by changing the direction of magnetization of a magnetic element within the memory cell, and a bit is read by measuring the resistance of the memory cell (low resistance typically represents a "0" bit and high resistance typically represents a "1" bit). As used herein, direction of magnetization is the direction that the magnetic moment is oriented.

MRAM and other non-volatile memory cells experience wear and have a limited lifetime. If some of the memory cells are accessed more frequently, they will age more quickly. To extend the useable of a memory device, wear-leveling techniques are used to reassign logical addresses to different physical addresses in order to make wear more uniform across the memory cells of the device.

BRIEF DESCRIPTION OF THE DRAWING

Like-numbered elements refer to common components in the different figures.

In some embodiments, the Front End Processor Circuit is part of a Controller.

Figure 3:
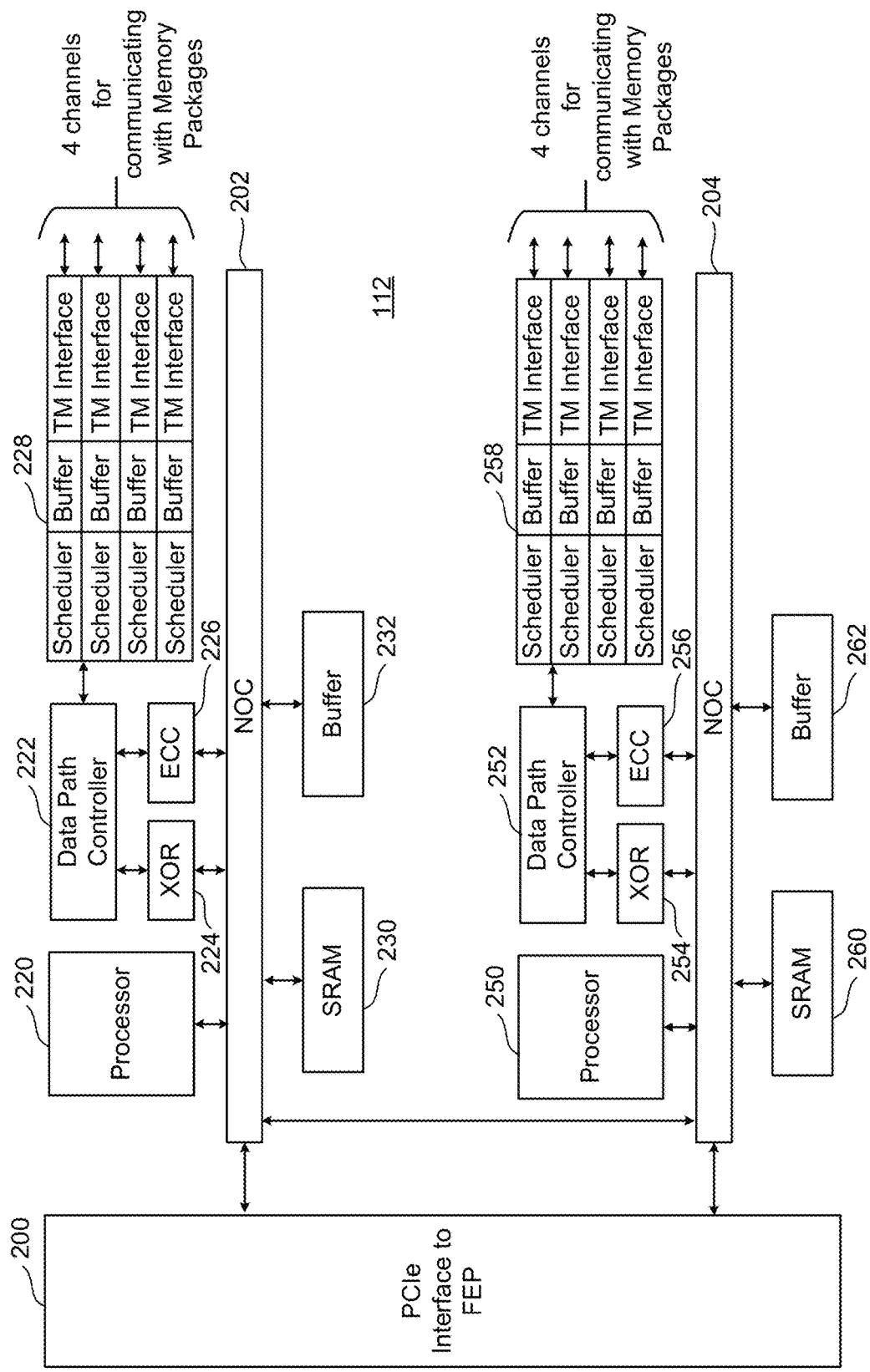

FIG. 3 is a block diagram of one embodiment of a Back End Processor Circuit.

In some embodiments, the Back End Processor Circuit is part of a Controller.

Figure 4:
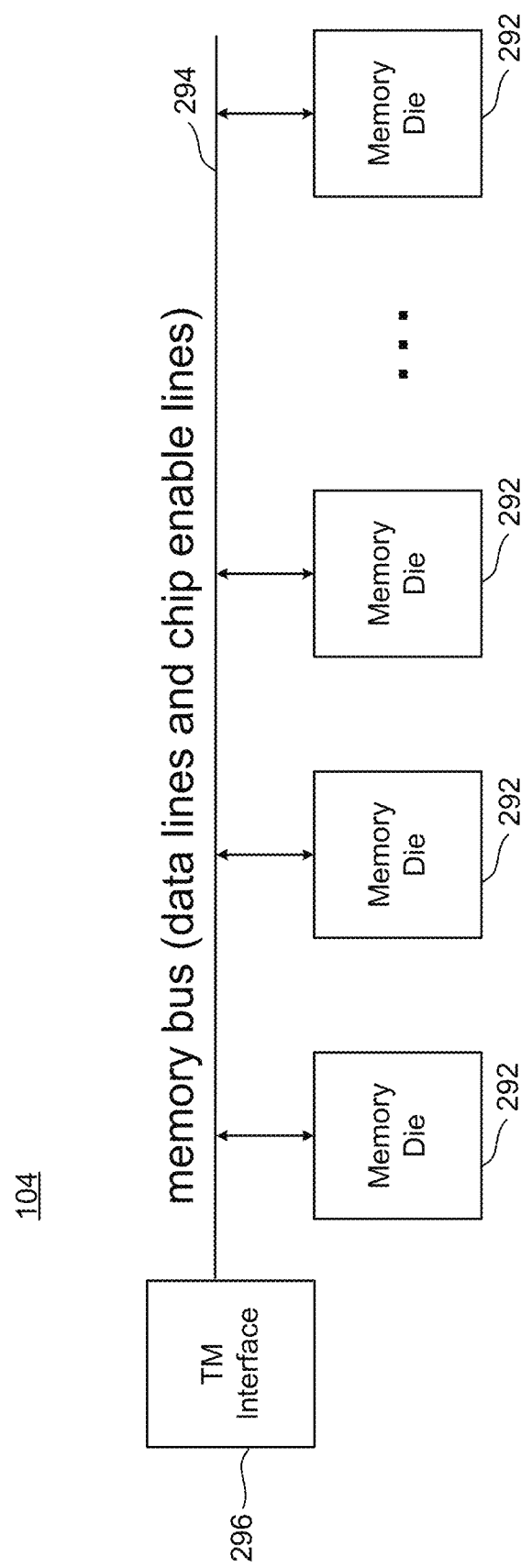

FIG. 4 is a block diagram of one embodiment of a memory package.

Figure 5:
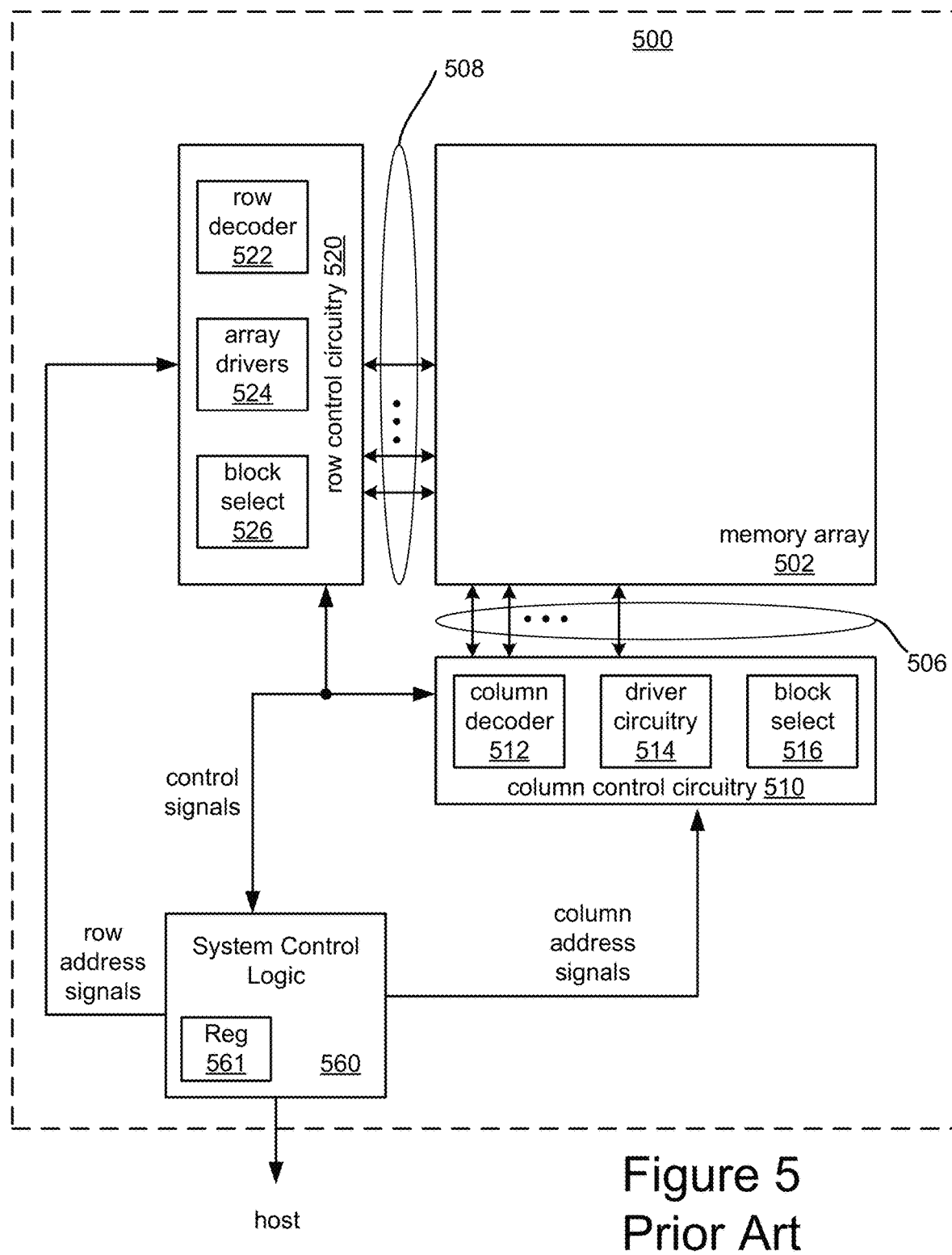

FIG. 5 is a block diagram of one embodiment of a memory die.

Figure 6A:
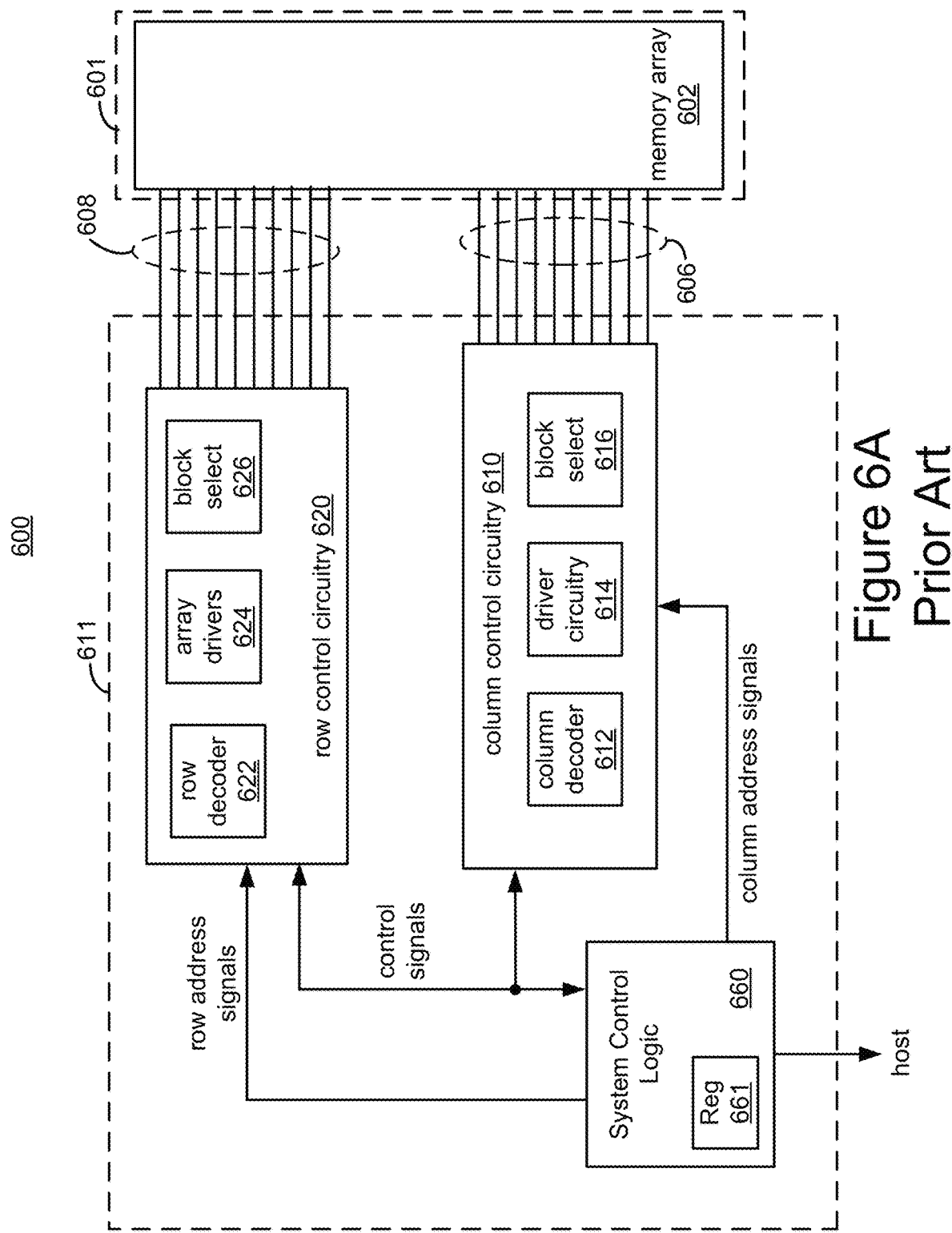
Figure 6B:
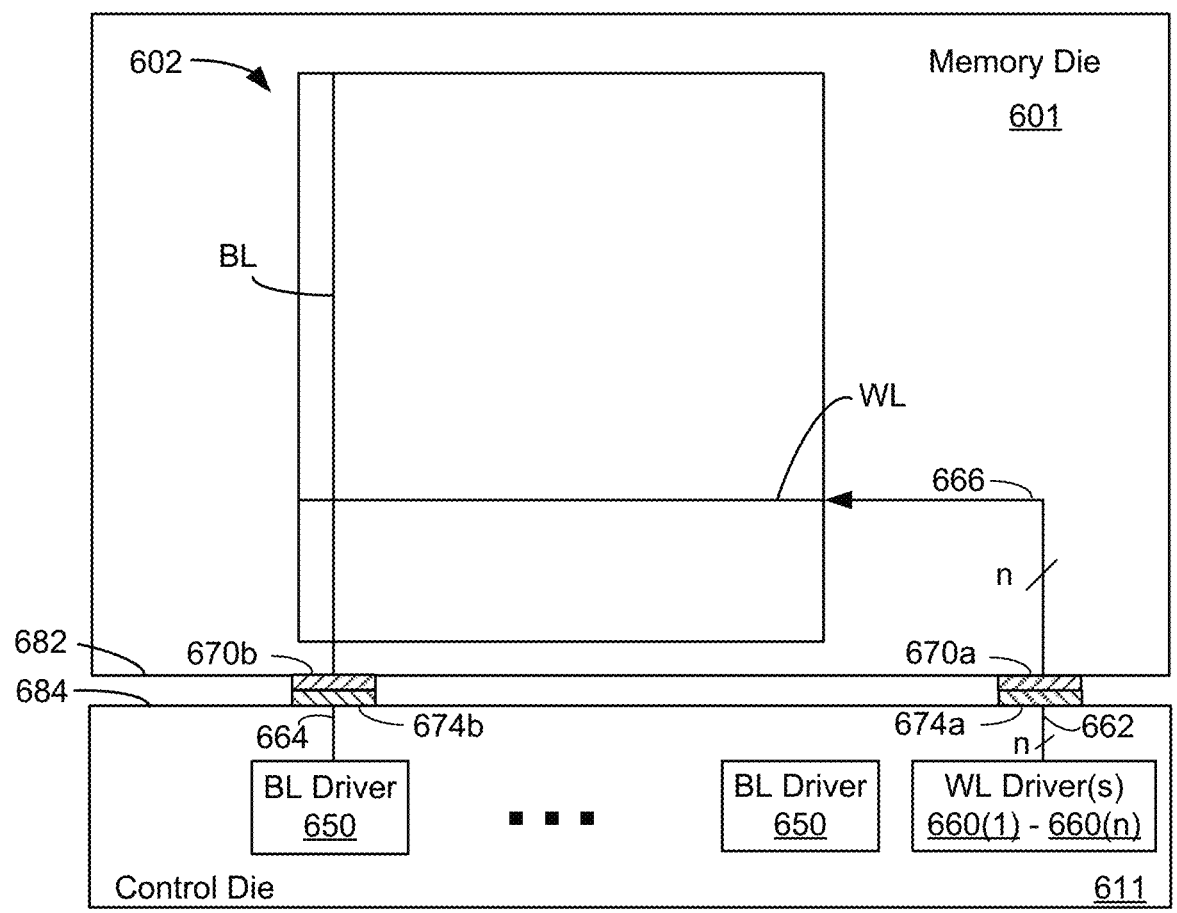

FIGS. 6A and 6B illustrate an example of control circuits coupled to a memory structure through wafer-to-wafer bonding.

Figure 7A:
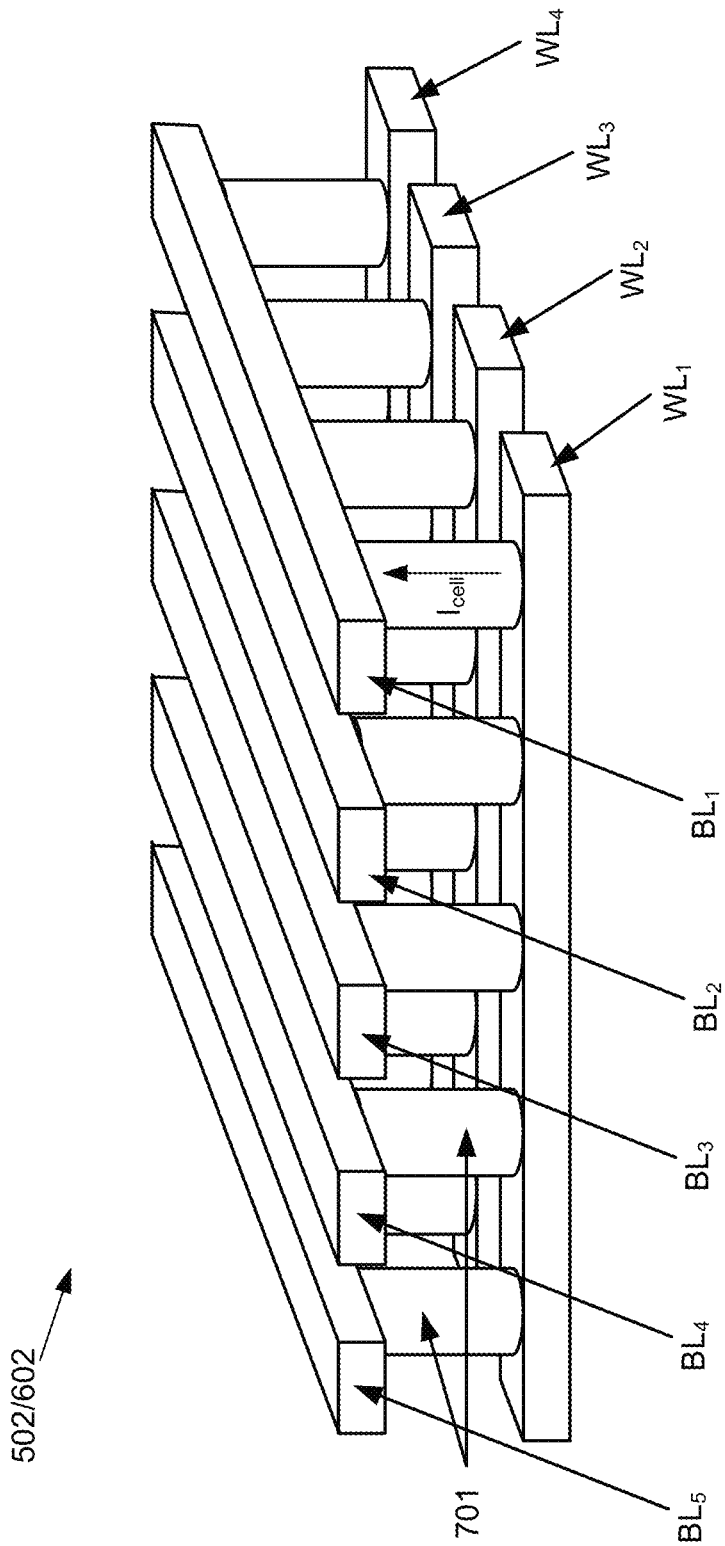

FIG. 7A depicts one embodiment of a portion of a memory array that forms a cross-point architecture in an oblique view.

Figure 7B:
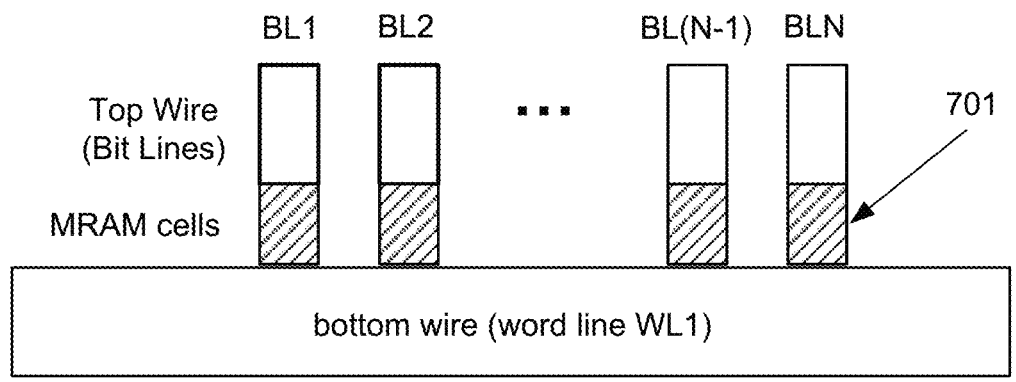
Figure 7C:
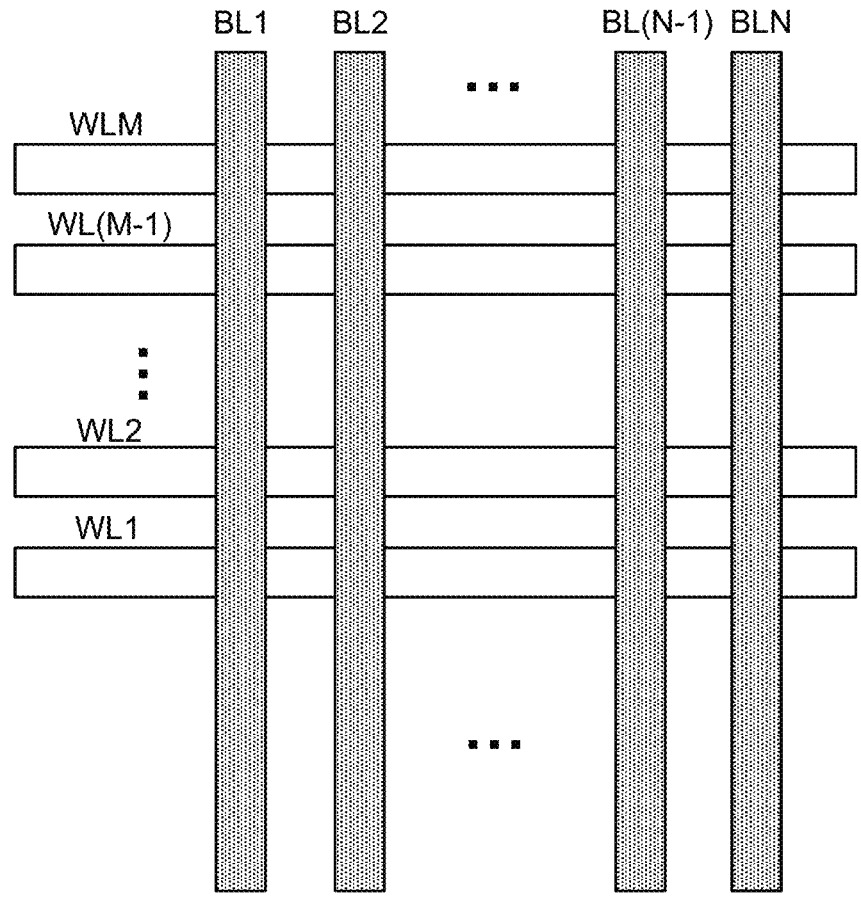

FIGS. 7B and 7C respectively present side and top views of the cross-point structure in FIG. 7A.

Figure 7D:
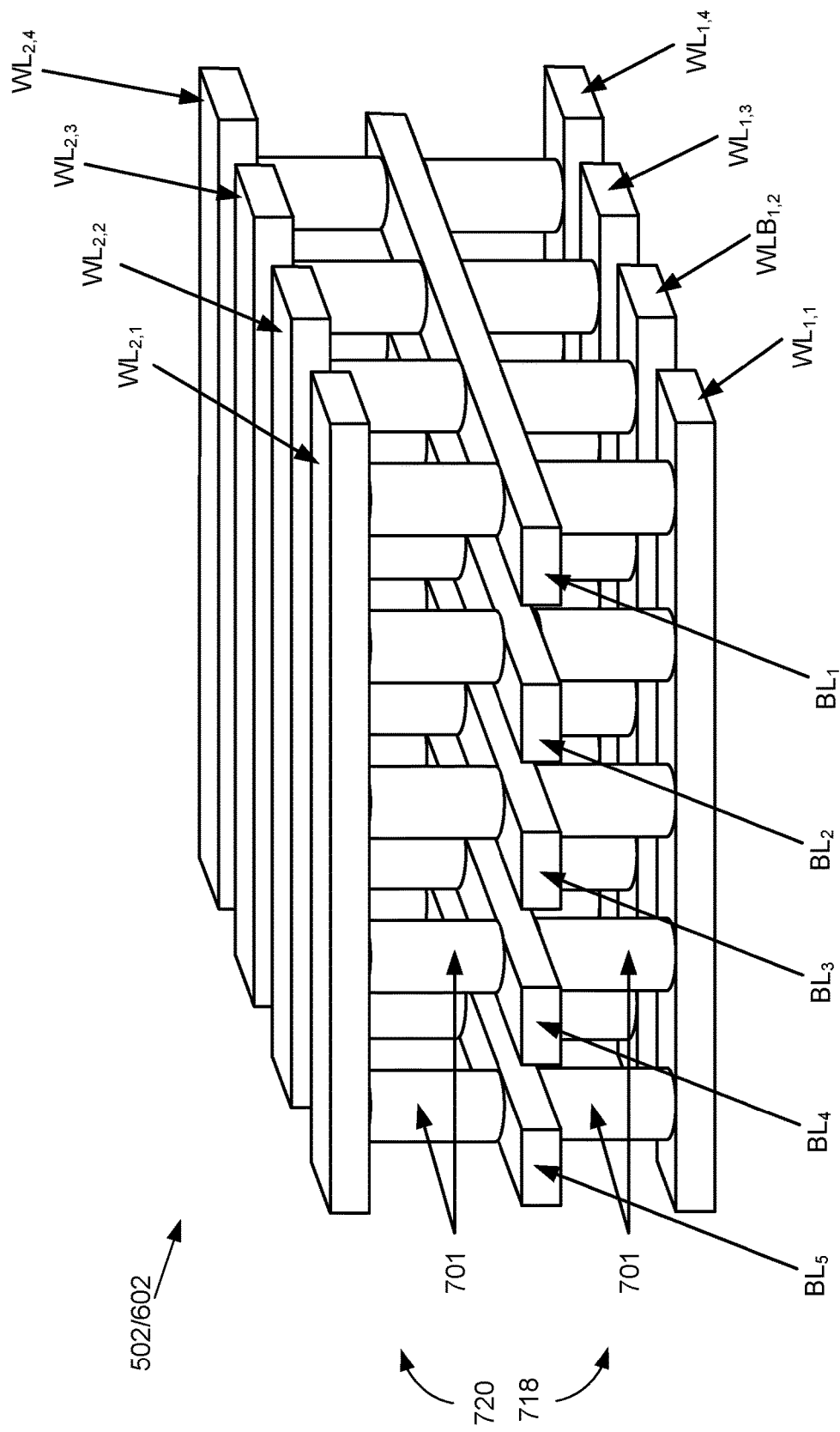

FIG. 7D depicts an embodiment of a portion of a two level memory array that forms a cross-point architecture in an oblique view.

Figure 8:
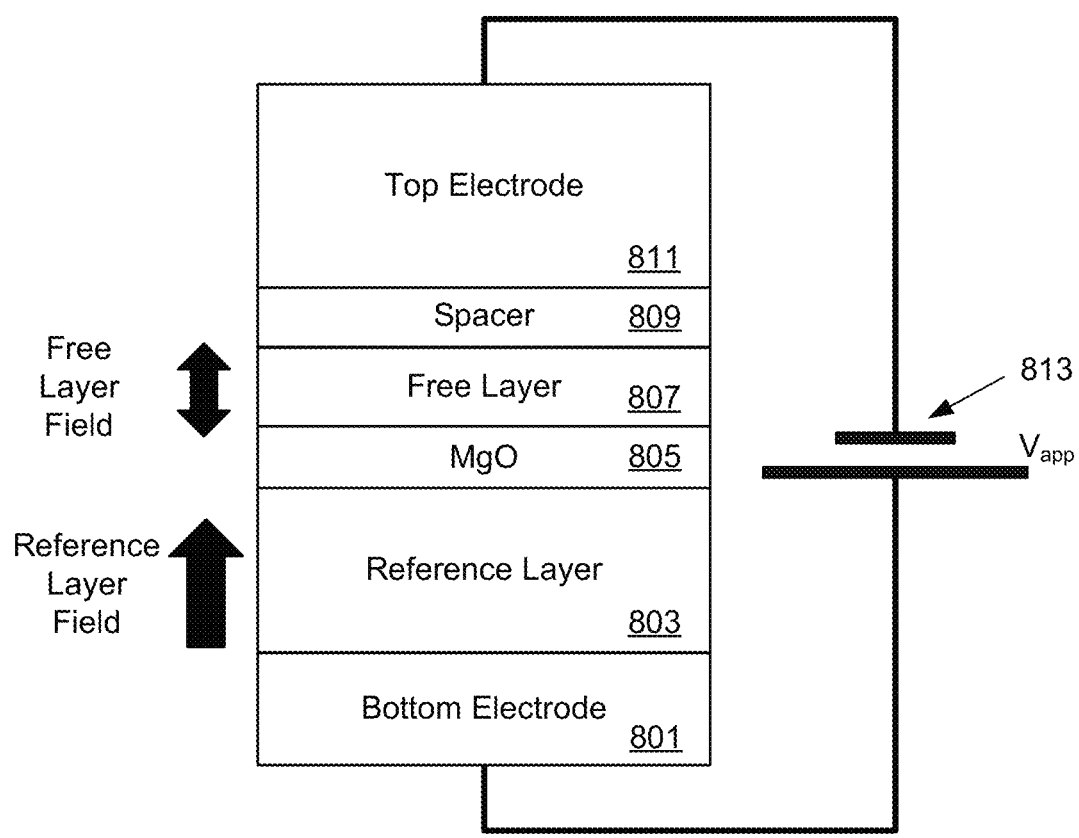

FIG. 8 illustrates an embodiment for the structure of an MRAM memory cell.

Figure 9:
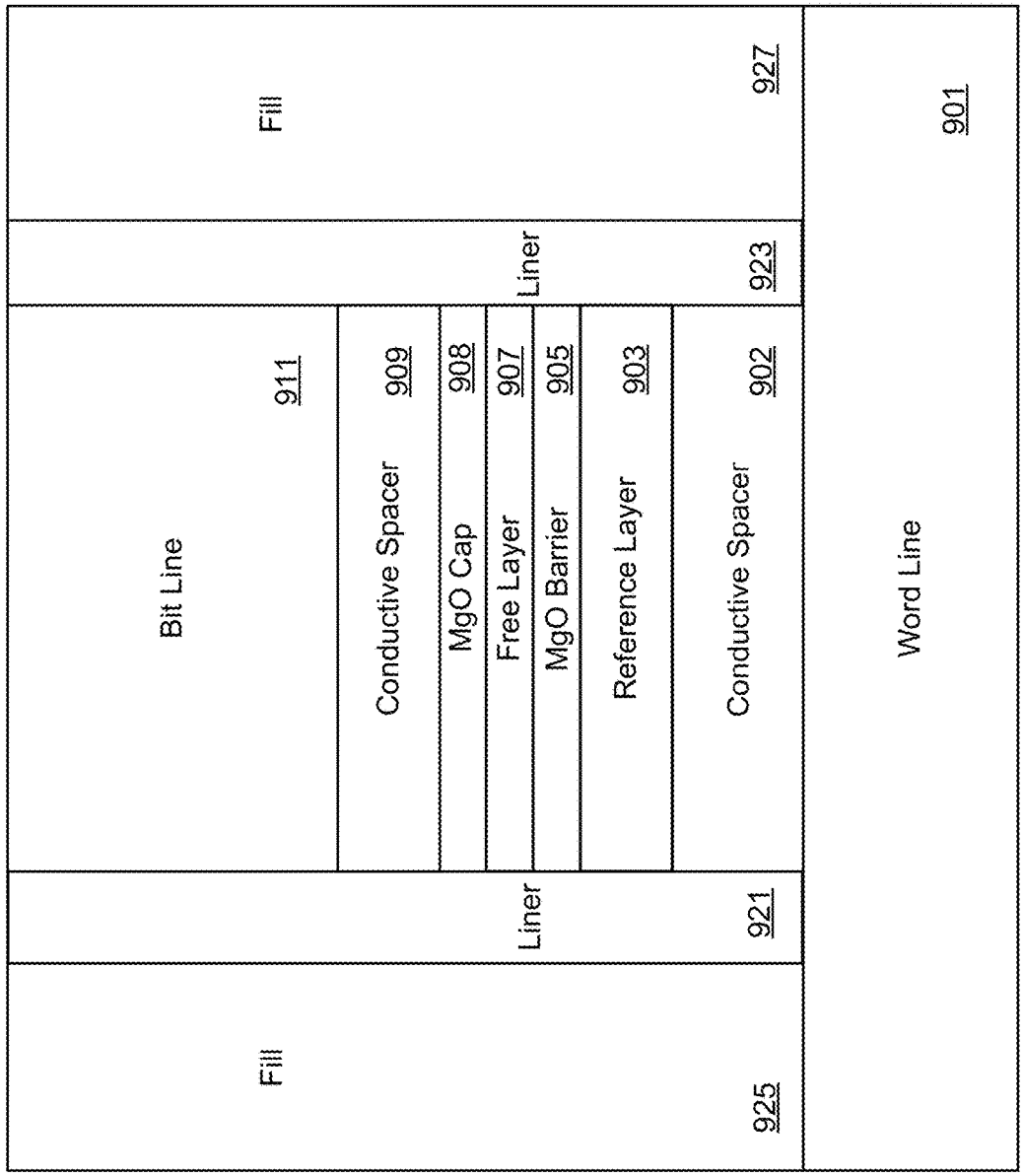

FIG. 9 illustrates an embodiment for an MRAM memory cell design as it would be implemented in a cross-point array in more detail.

Figure 10A:
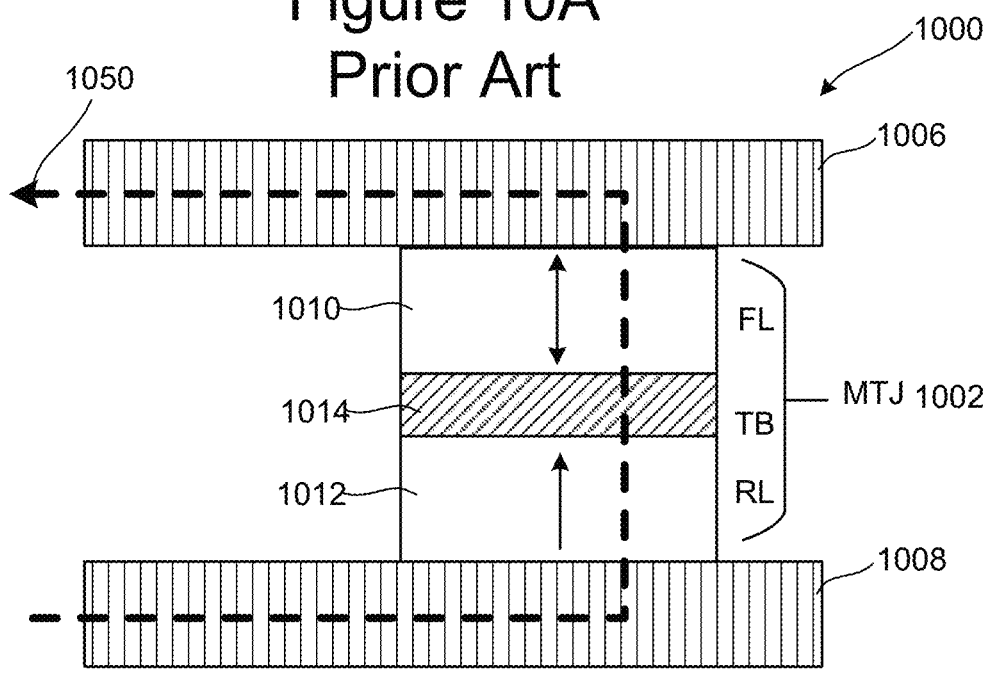
Figure 10B:
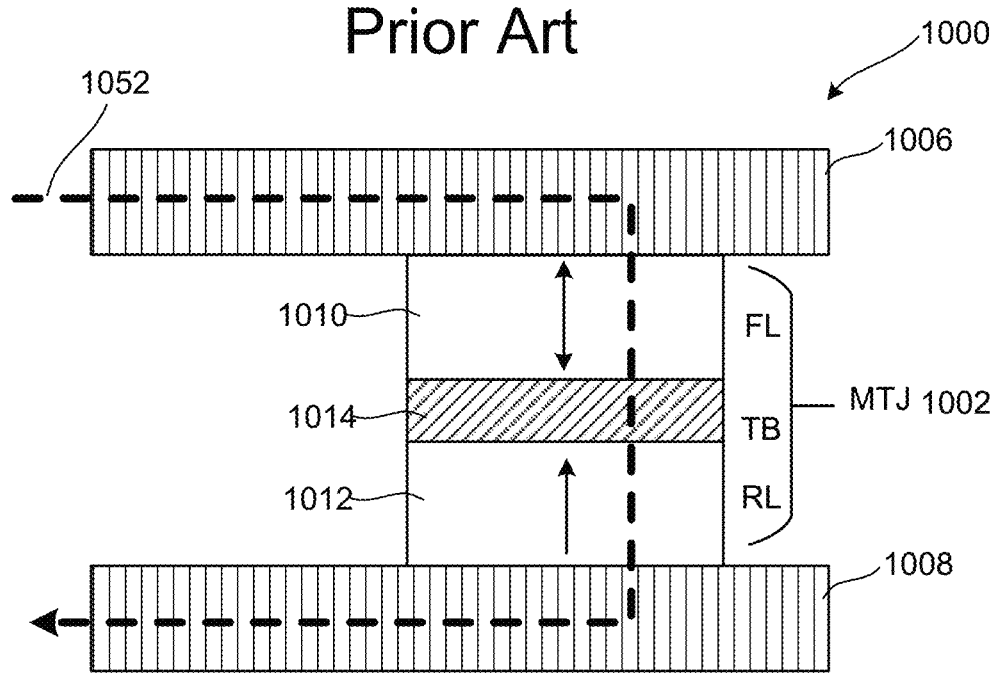

FIGS. 10A and 10B illustrate the writing of an MRAM memory cell by use of a spin torque transfer (STT) mechanism.

Figure 11A:
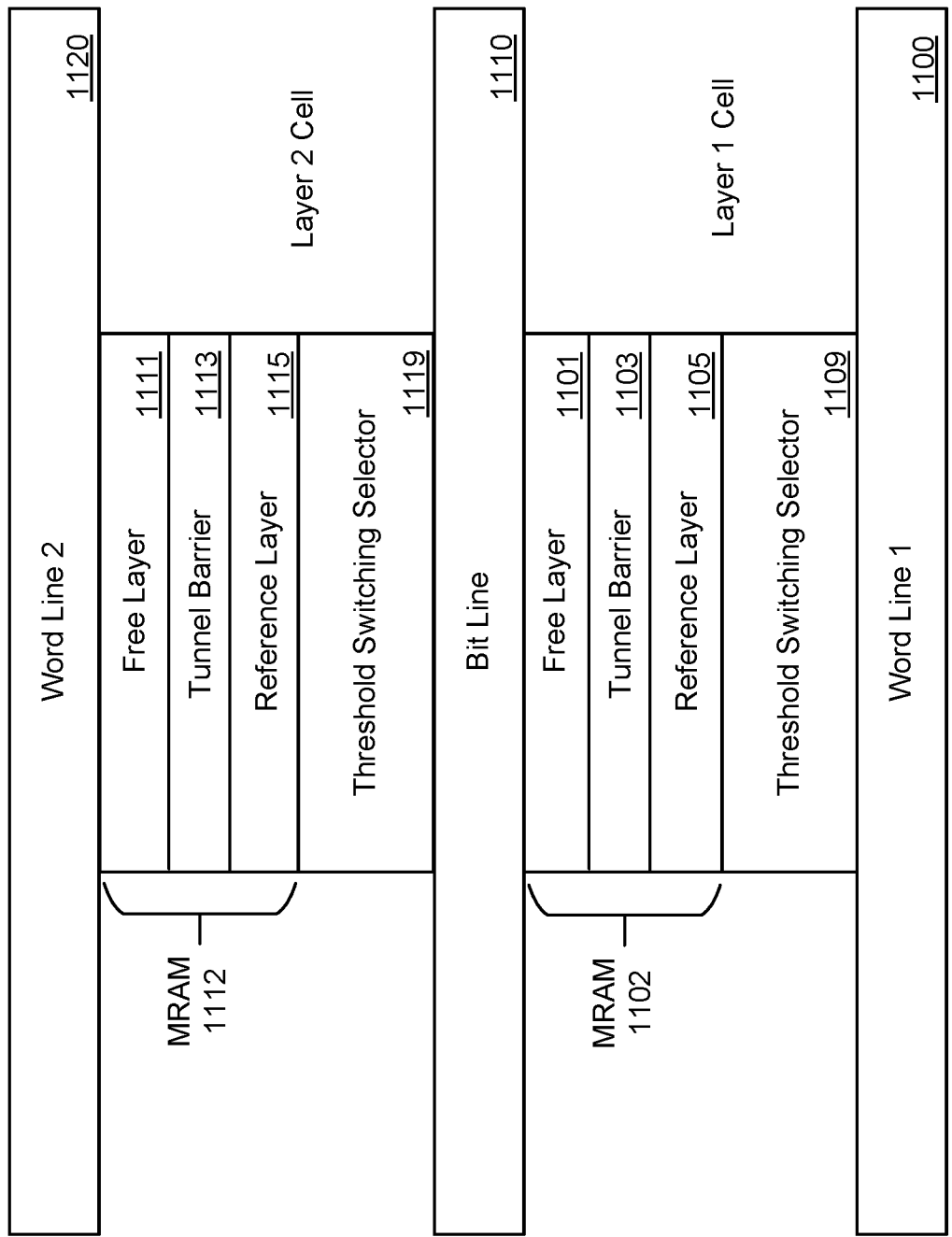
Figure 11B:
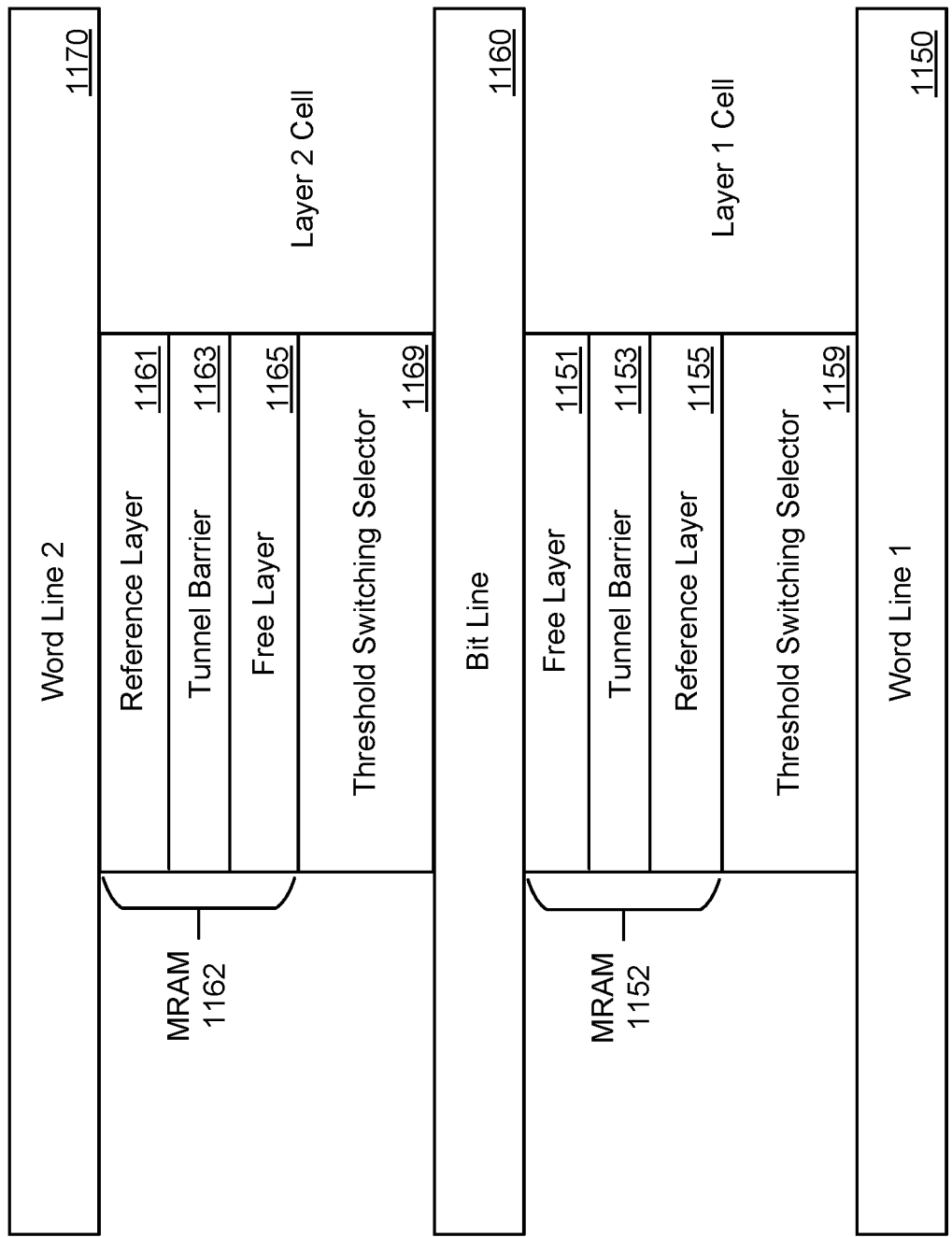

FIGS. 11A and 11B illustrate embodiments for the incorporation of threshold switching selectors into an MRAM memory array having a cross-point architecture.

Figure 12:
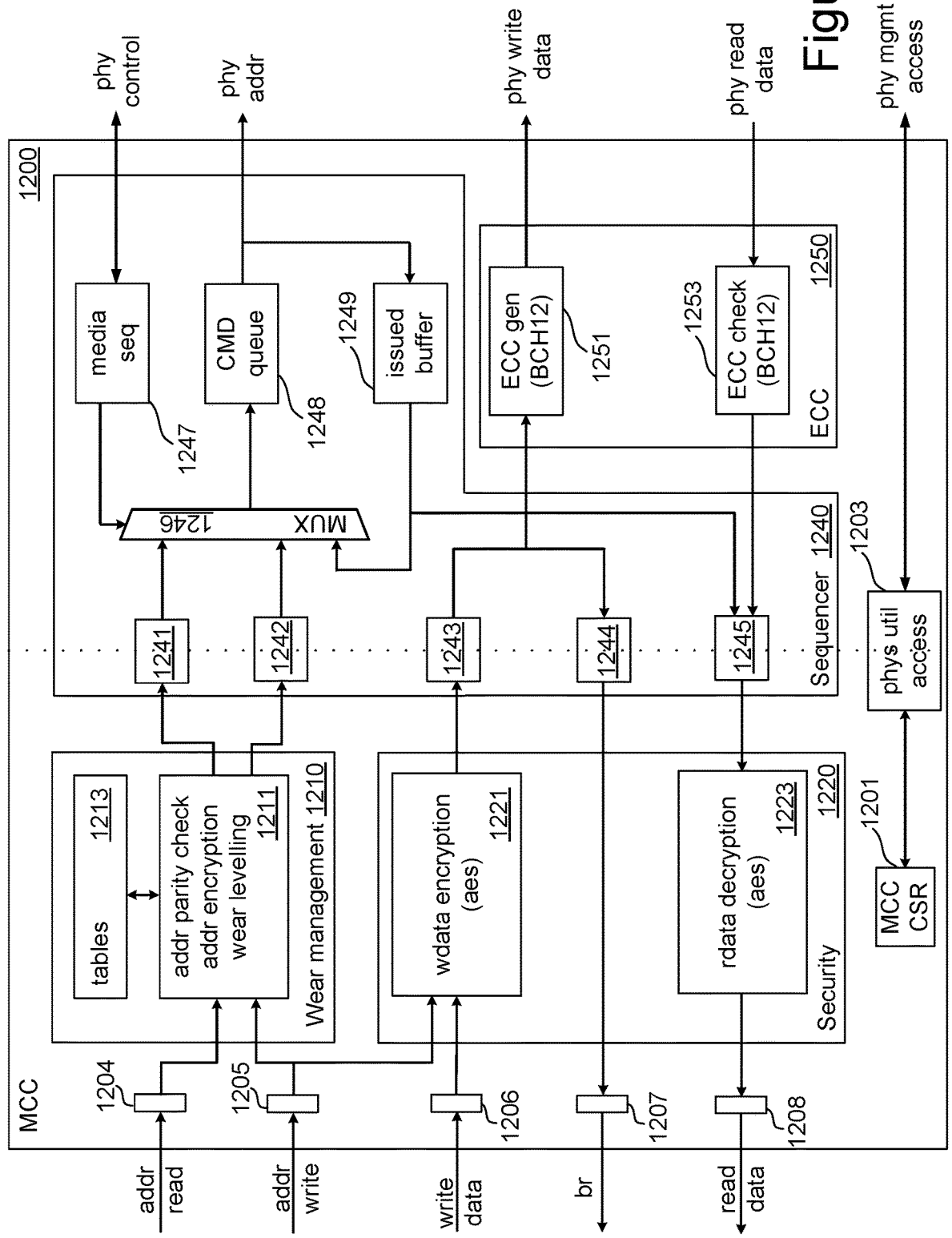

FIG. 12 is a block diagram for elements of an embodiment for a memory controller that can include secure wear levelling using a Galois field having a size based on the memory structure.

Figure 13:
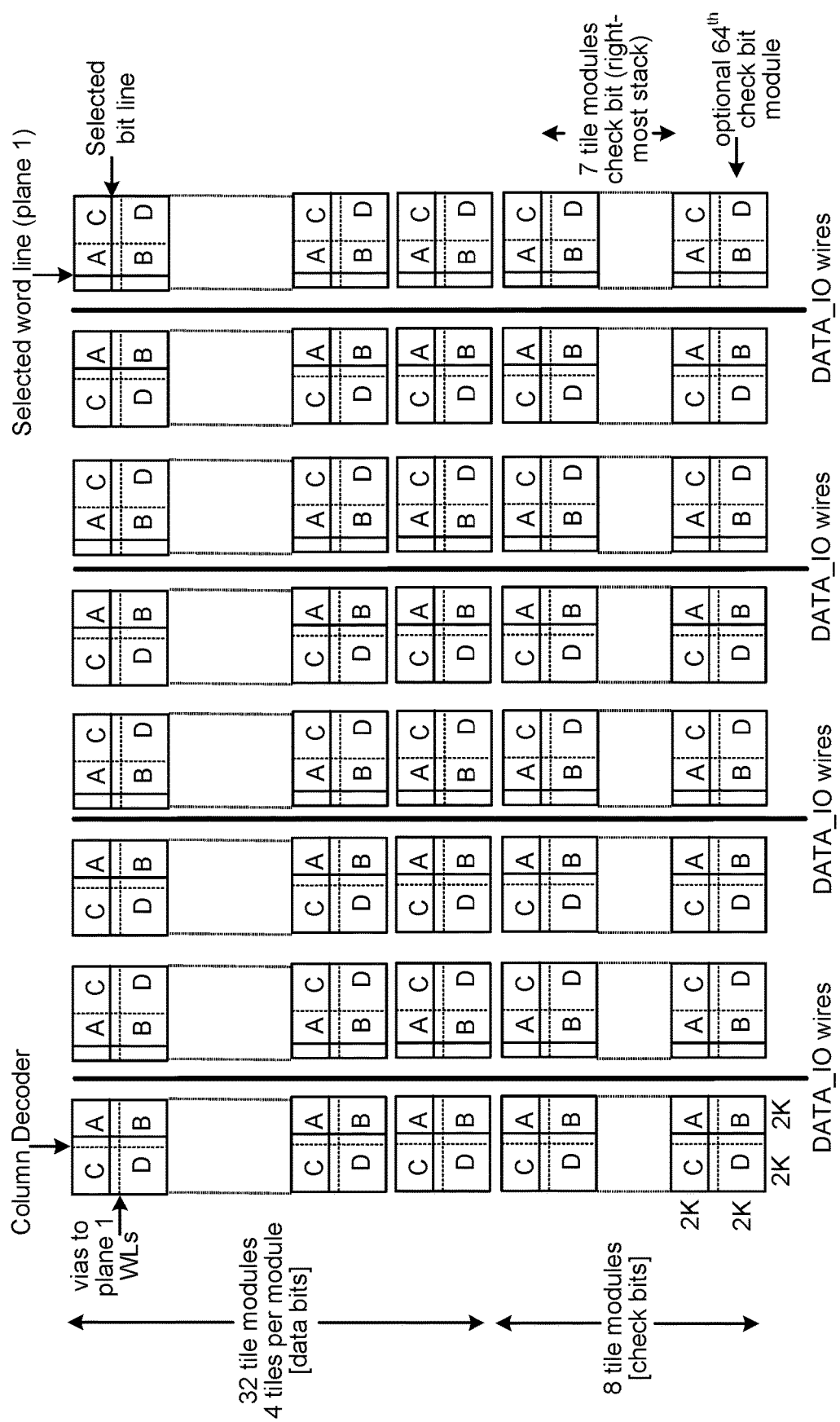

FIG. 13 illustrates features of a 2 Gb MRAM memory bank embodiment for which Galois field secure wear levelling can be used.

Figure 14:
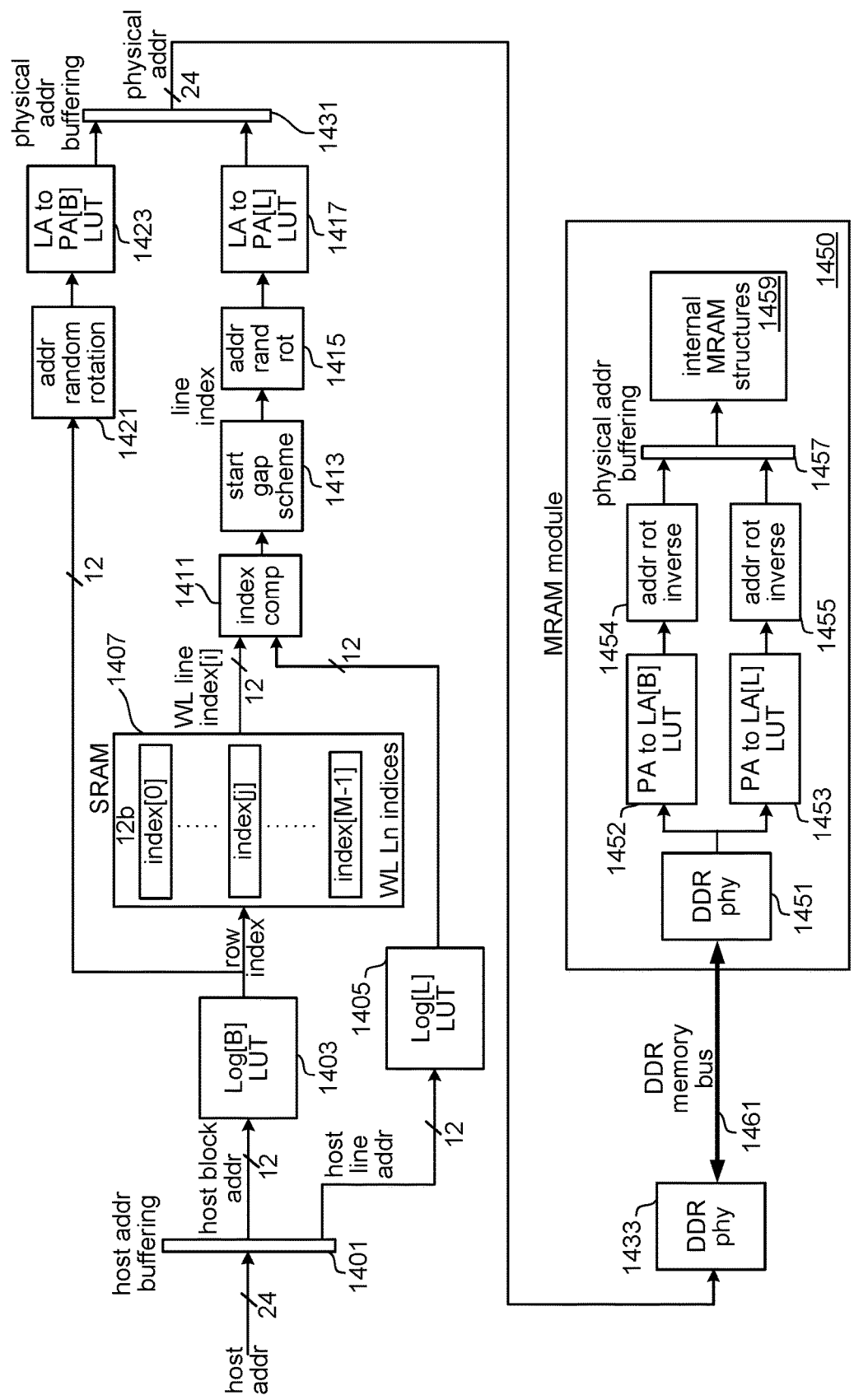

FIG. 14 is block diagram of a secure dynamic wear levelling system illustrating the path for host addresses to a memory module.

FIGS. 15-19 provide an example of the recursive $GF(2^{12})$ random matrix mask calculation.

Figure 20:
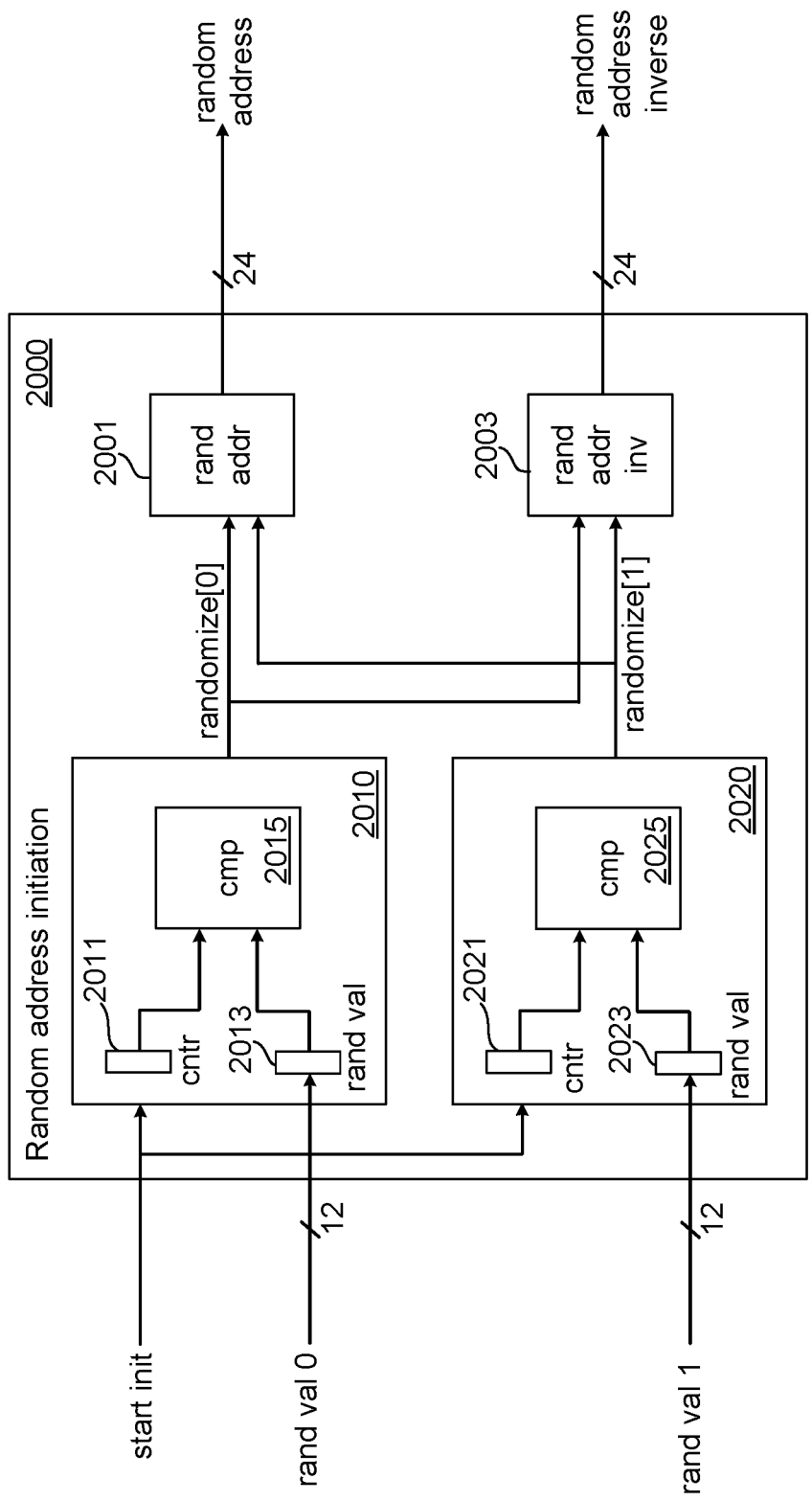
Figure 21:
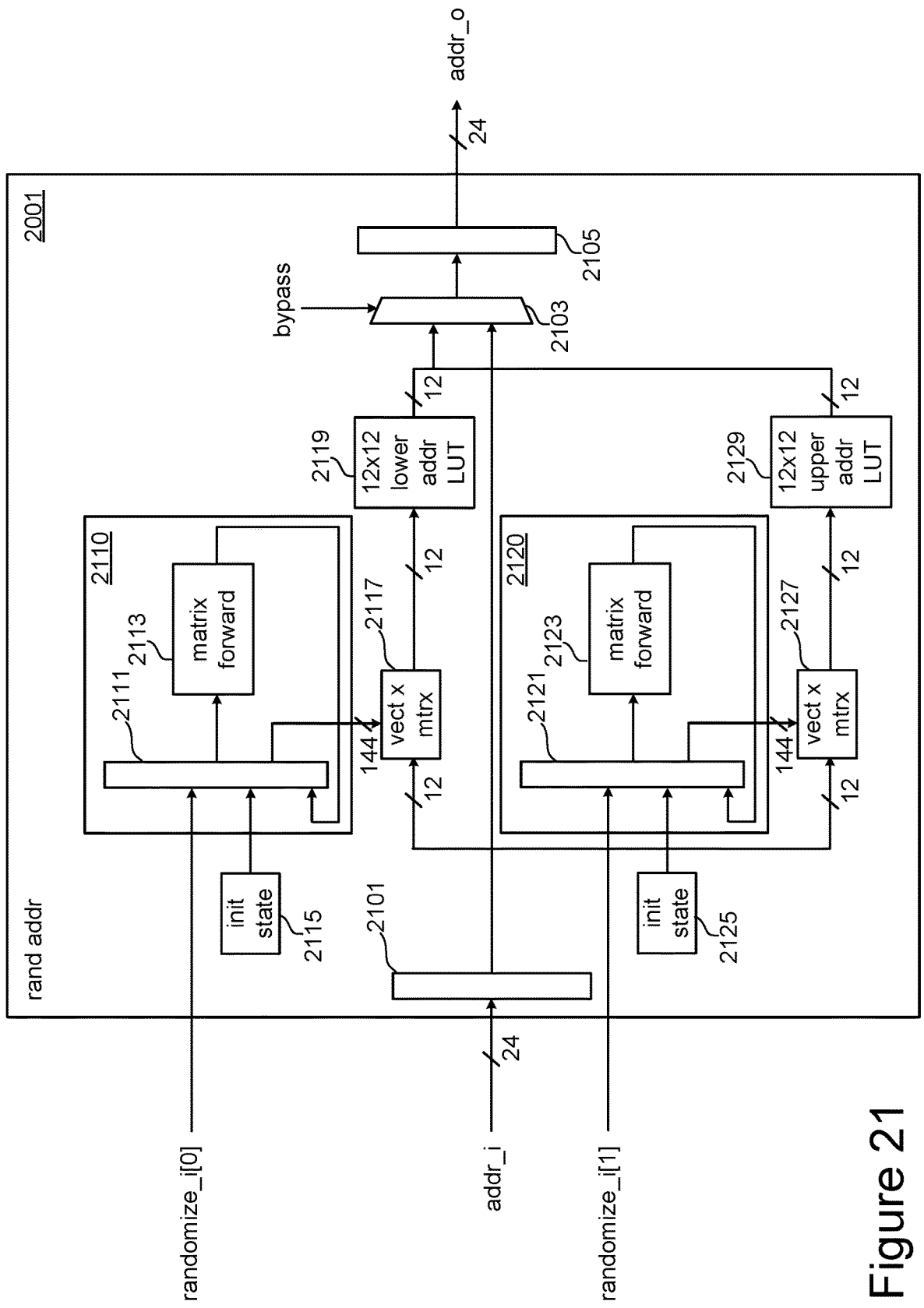
Figure 22:
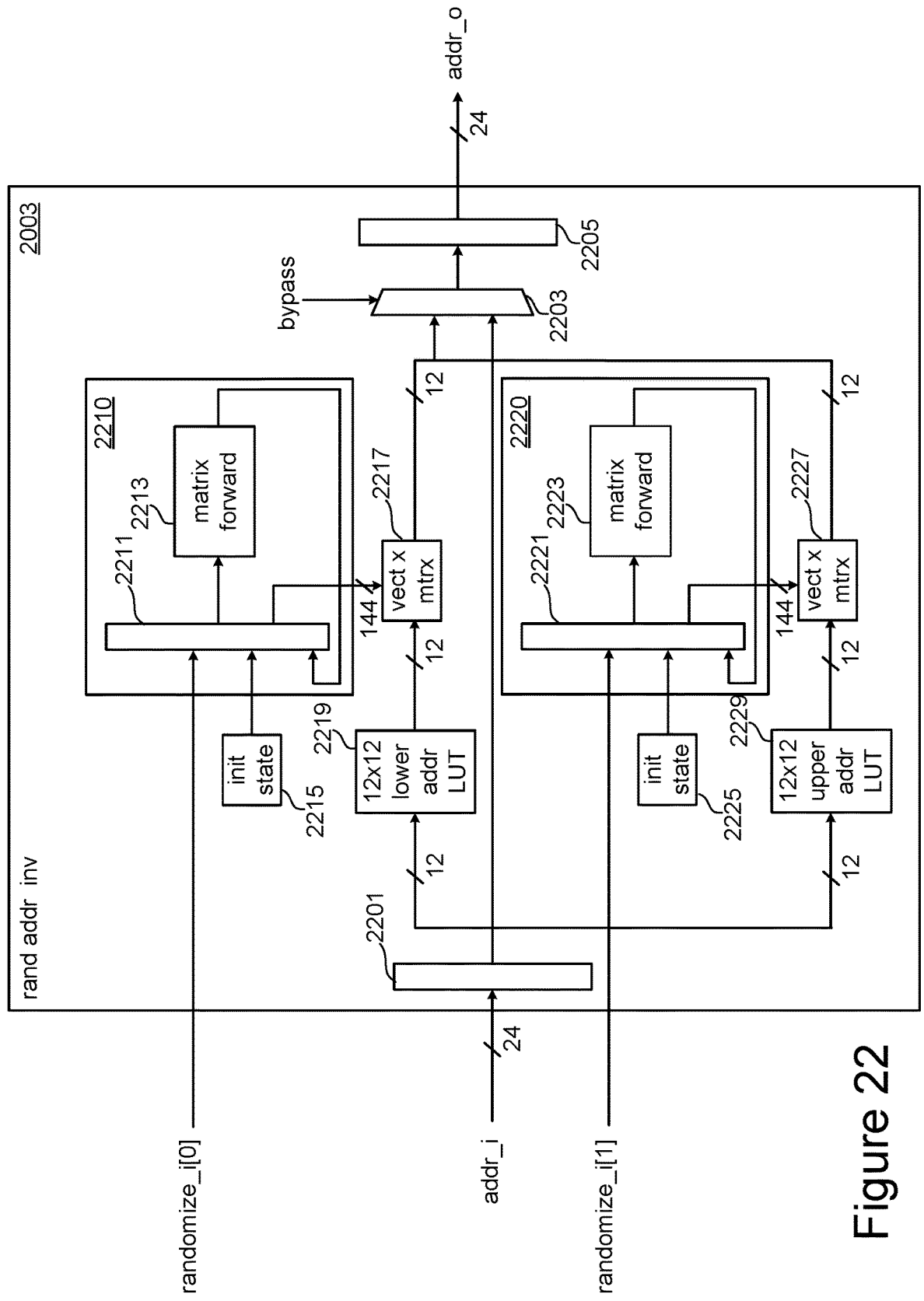

FIGS. 20-22 present an embodiment for the random address rotation circuitry.

Figures 15, 16:
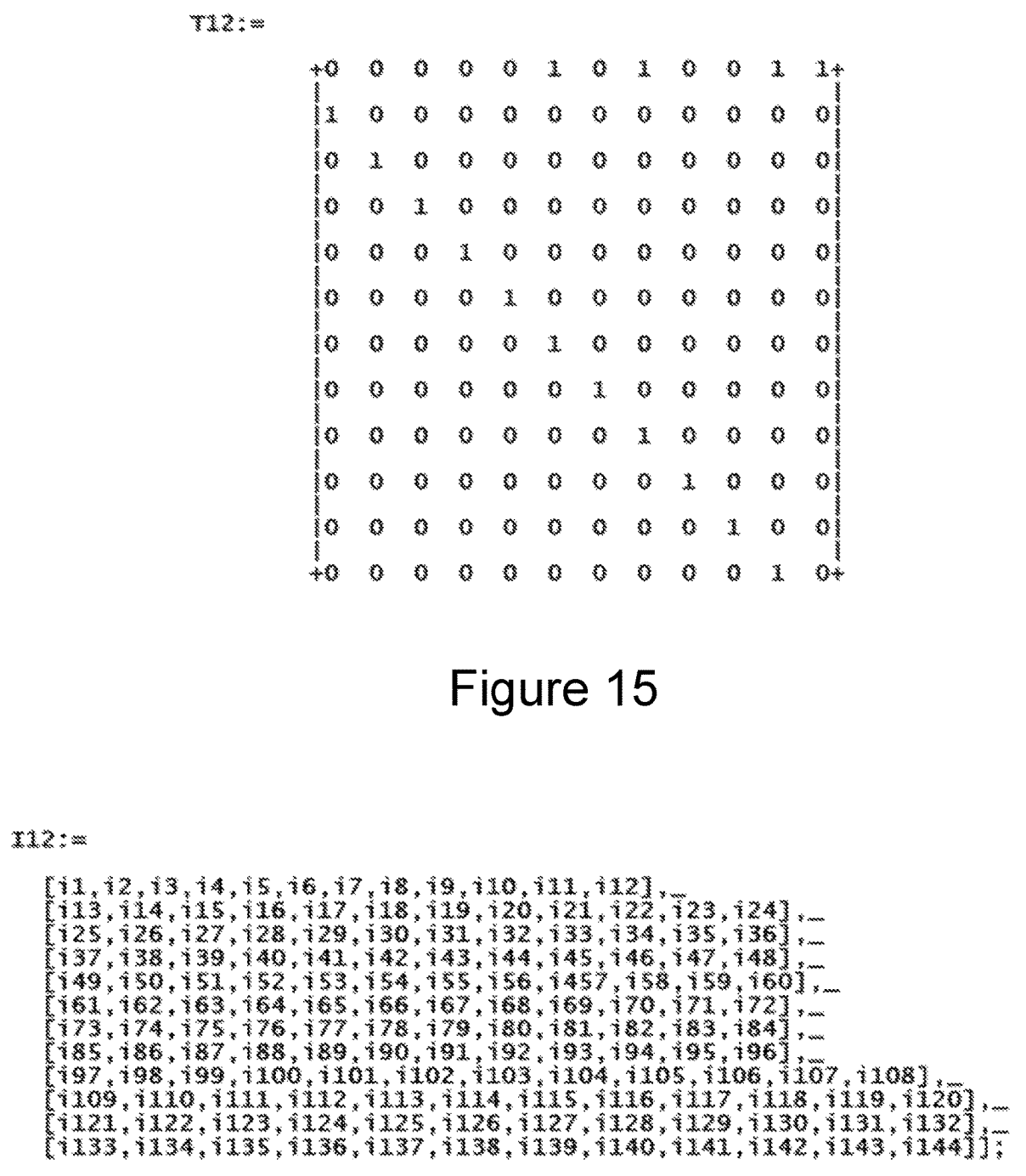
Figure 17:
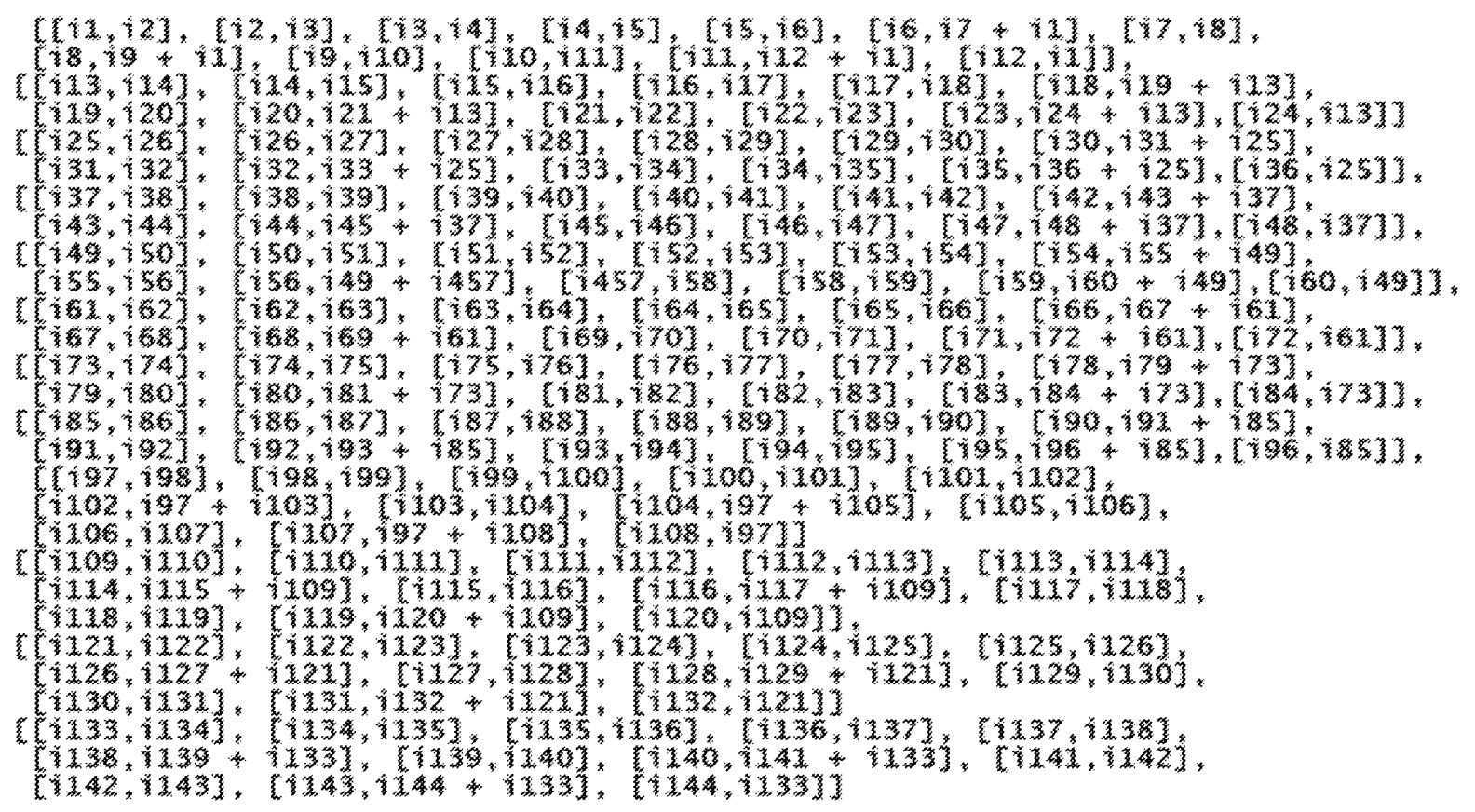
Figure 24:
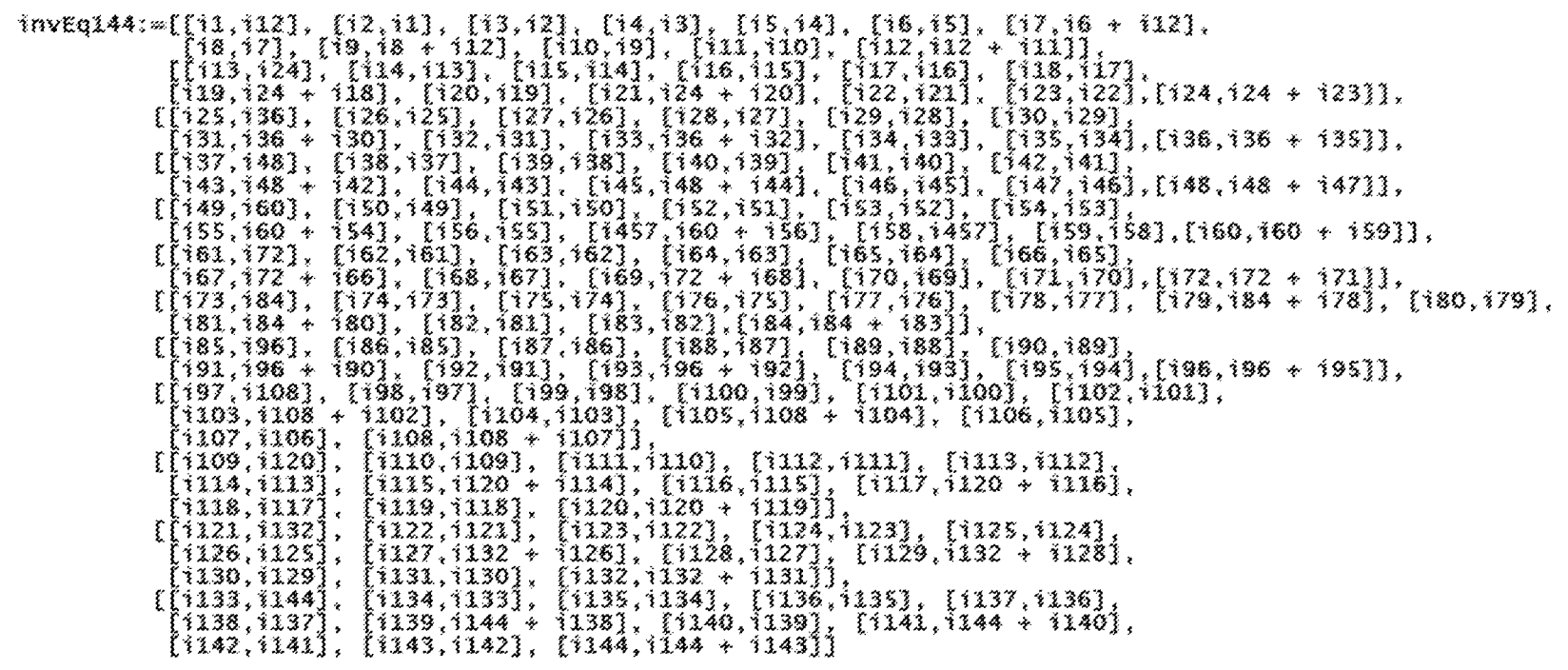
Figure 25:
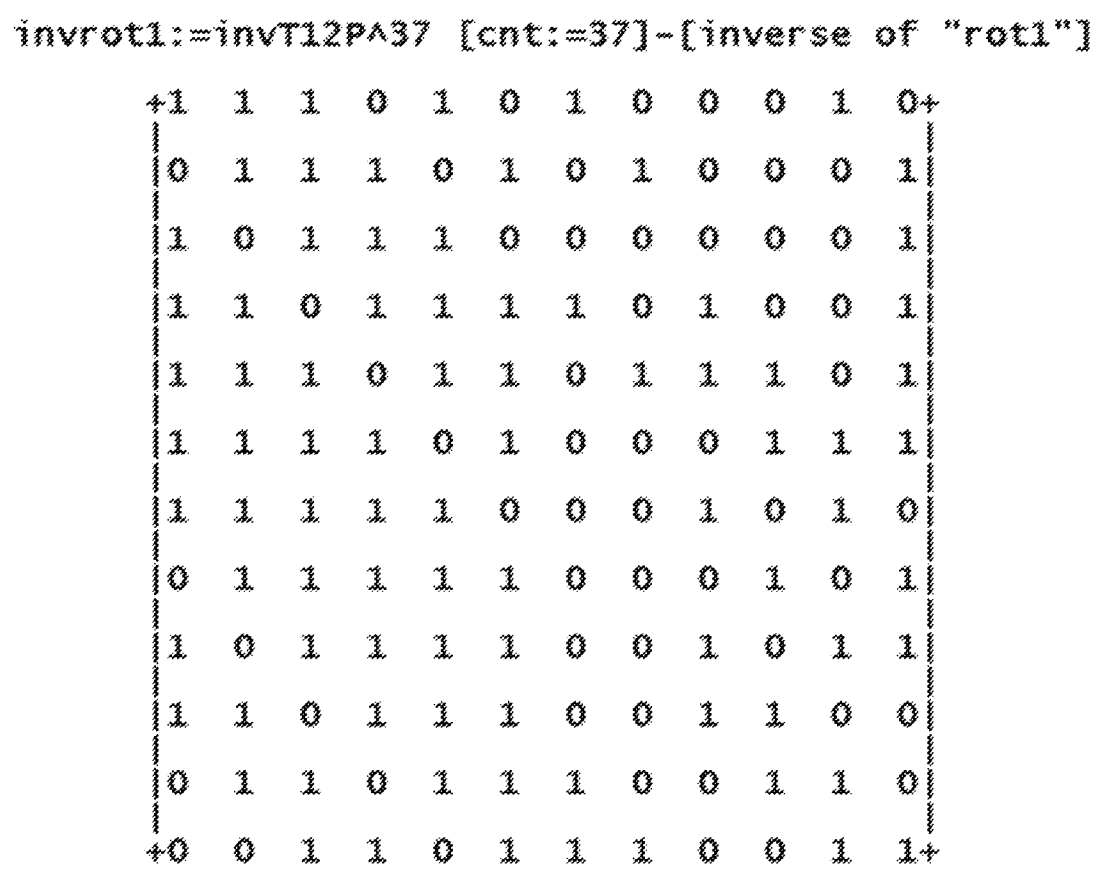

FIGS. 23-25 provide an example of the inverse to the example of the recursive $GF(2^{12})$ random matrix mask calculation of FIGS. 15, 17, and 18.

Figure 26:
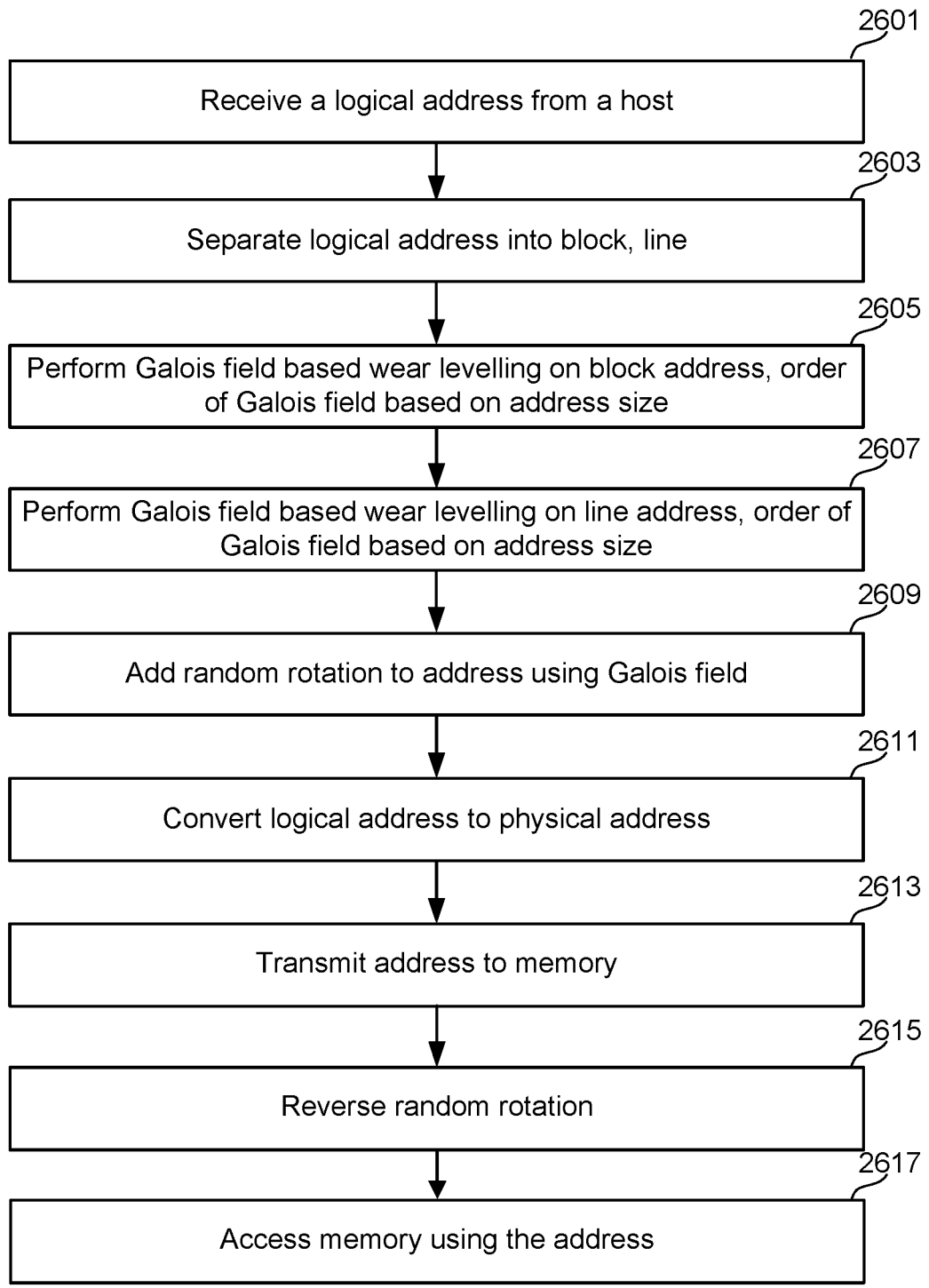

FIG. 26 is a flowchart illustrating an embodiment of secure wear levelling operations for a non-volatile memory.

DETAILED DESCRIPTION

The following presents wear levelling techniques based on use of a Galois field for the logical to physical translation of data addresses for a non-volatile memory, such as an MRAM-based memory. This not only provides a wear levelling technique to extend memory life, but also adds an additional layer of security to the stored memory data. More specifically, the following presents embodiments for secure wear levelling based on a Galois field having an order based on the size of the memory. To further improve security, a randomly generated rotation of the logically address based on the Galois field can also be used.

Figure 1:
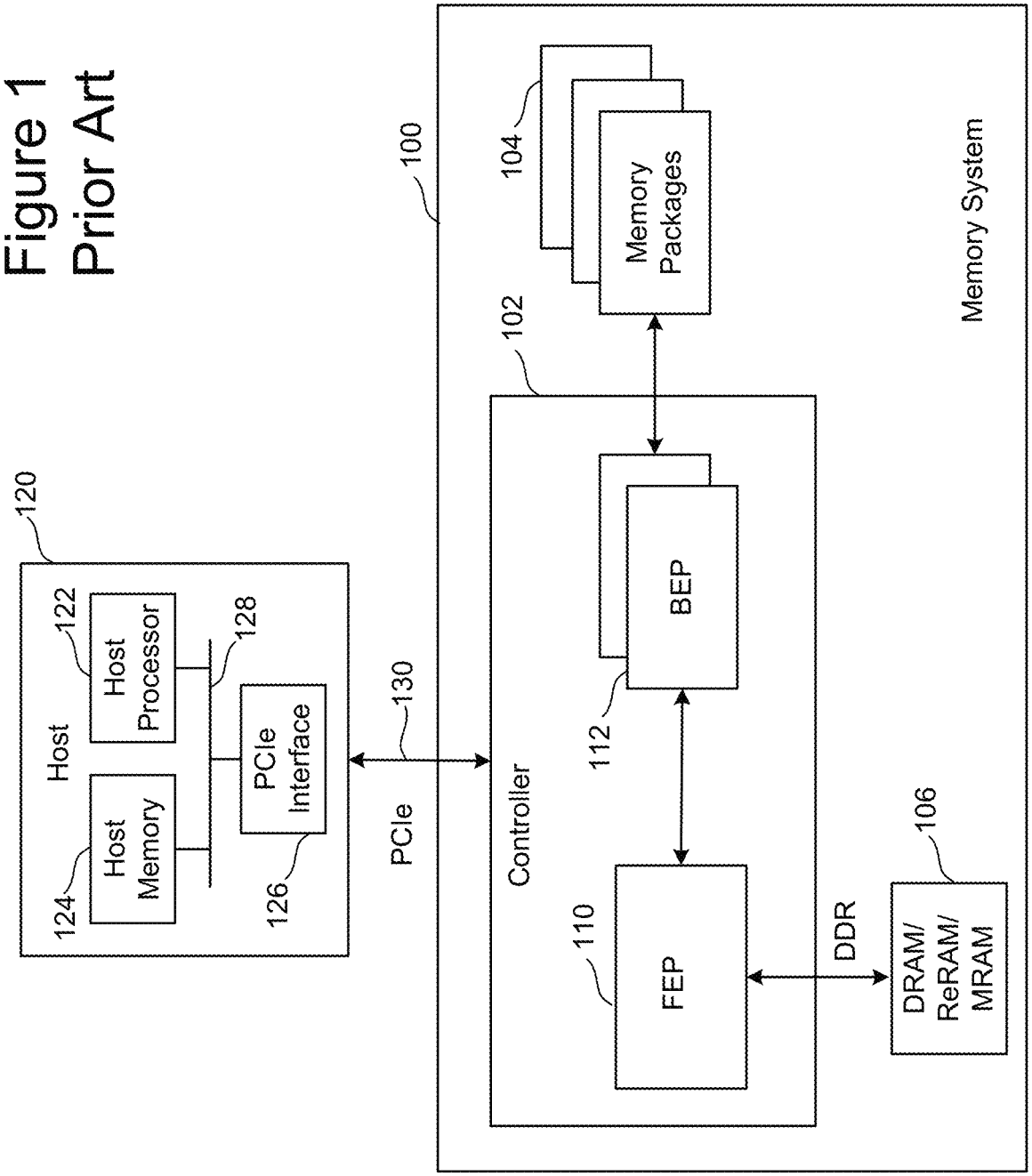
FIG. 1 is a block diagram of one embodiment of a memory system connected to a host.

FIG. 1 is a block diagram of one embodiment of a memory system 100 connected to a host 120. Memory system 100 can implement the technology presented herein for secure wear levelling. Many different types of memory systems can be used with the technology proposed herein. Example memory systems include solid state drives ("SSDs"), memory cards including dual in-line memory modules (DIMMs) for DRAM replacement, and embedded memory devices; however, other types of memory systems can also be used.

Memory system 100 of FIG. 1 comprises a controller 102, non-volatile memory 104 for storing data, and local memory (e.g., DRAM/ReRAM/MRAM) 106. Controller 102 comprises a Front End Processor (FEP) circuit 110 and one or more Back End Processor (BEP) circuits 112. In one embodiment FEP circuit 110 is implemented on an Application Specific Integrated Circuit (ASIC). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM). In other embodiments, the BEP or FEP can be included on the memory die.

Controller 102 communicates with host 120 via an interface 130 that implements a protocol such as, for example, NVM Express (NVMe) or Compute Express Link (CXL) over PCI Express (PCIe) or using JEDEC standard Double Data Rate or Low-Power Double Data Rate (DDR or LPDDR) interface such as DDR5 or LPDDR5. For working with memory system 100, host 120 includes a host processor 122, host memory 124, and a PCIe interface 126 connected along bus 128. Host memory 124 is the host's physical memory, and can be DRAM, SRAM, MRAM, non-volatile memory, or another type of storage. Host 120 is external to and separate from memory system 100. In one embodiment, memory system 100 is embedded in host 120.

Figure 2:
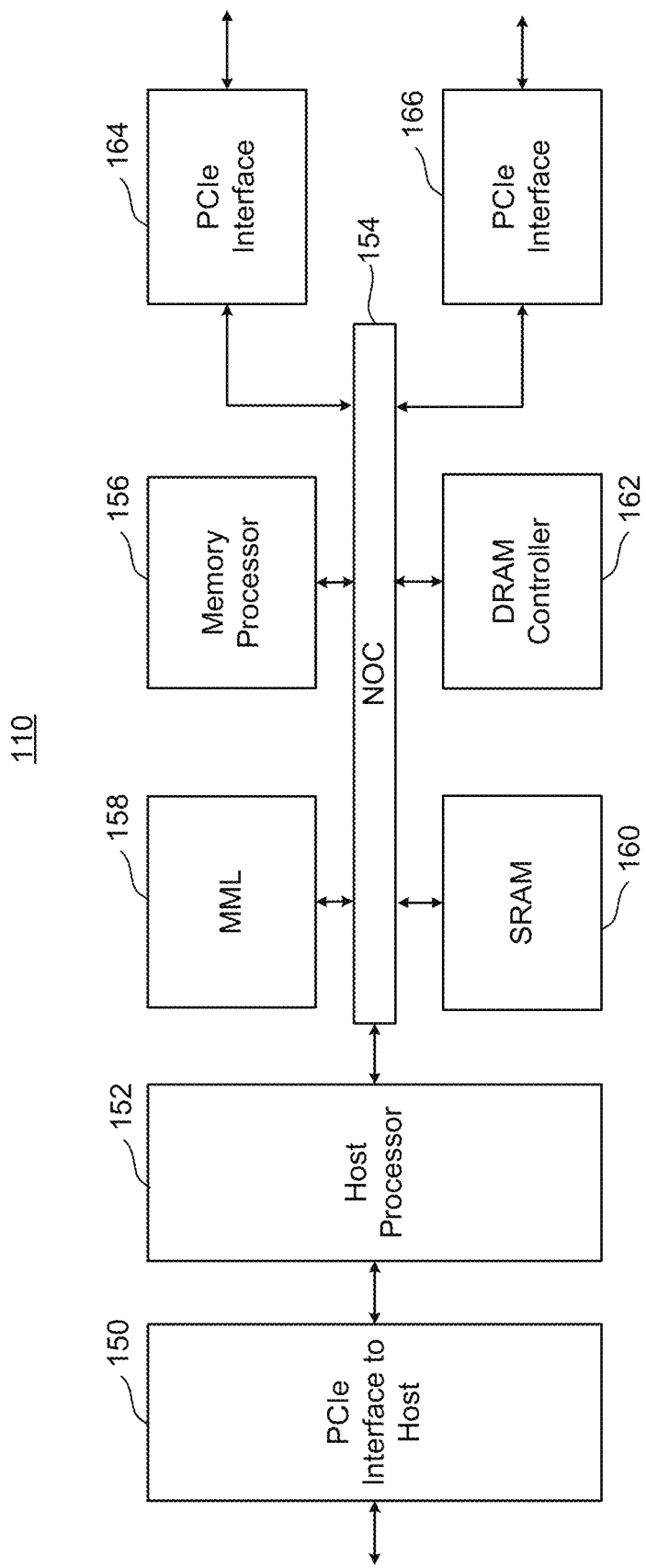
FIG. 2 is a block diagram of one embodiment of a Front End Processor Circuit.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 502/602 of FIGS. 5 and 6 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. In another embodiment, the Toggle Interface is instead JEDEC standard DDR or LPDDR with or without variations such as relaxed time-sets or smaller page size. The technology described herein is not limited to any particular number of memory die.

FIG. 5 is a block diagram that depicts one example of a memory system 500 that can implement the technology described herein. Memory system 500 includes a memory array 502 that can include any of memory cells described in the following. The array terminal lines of memory array 502 include the various layer(s) of word lines organized as rows, and the various layer(s) of bit lines organized as columns. However, other orientations can also be implemented. Memory system 500 includes row control circuitry 520, whose outputs 508 are connected to respective word lines of the memory array 502. Row control circuitry 520 receives a group of M row address signals and one or more various control signals from System Control Logic circuit 560, and typically may include such circuits as row decoders 522, array terminal drivers 524, and block select circuitry 526 for both reading and writing operations. Memory system 500 also includes column control circuitry 510 whose input/outputs 506 are connected to respective bit lines of the memory array 502. Although only single block is shown for array 502, a memory die can include multiple arrays or "tiles" that can be individually accessed. Column control circuitry 510 receives a group of N column address signals and one or more various control signals from System Control Logic 560, and typically may include such circuits as column decoders 512, array terminal receivers or drivers 514, block select circuitry 516, as well as read/write circuitry, and I/O multiplexers.

System control logic 560 receives data and commands from a host and provides output data and status to the host. In other embodiments, system control logic 560 receives data and commands from a separate controller circuit and provides output data to that controller circuit, with the controller circuit communicating with the host. In some embodiments, the system control logic 560 can include a state machine that provides die-level control of memory operations. In one embodiment, the state machine is programmable by software. In other embodiments, the state machine does not use software and is completely implemented in hardware (e.g., electrical circuits). In another embodiment, the state machine is replaced by a micro-controller, with the micro-controller either on or off the memory chip. The system control logic 560 can also include a power control module controls the power and voltages supplied to the rows and columns of the memory 502 during memory operations and may include charge pumps and regulator circuit for creating regulating voltages. System control logic 560 may include one or more state machines, registers and other control logic for controlling the operation of memory system 500. Registers at 561 can store various operating parameters, such as those related to wear levelling as discussed in more detail below. In some embodiments, all of the elements of memory system 500, including the system control logic 560, can be formed as part of a single die. In other embodiments, some or all of the system control logic 560 can be formed on a different die.

For purposes of this document, the phrase "one or more control circuits" can include a controller, a state machine, a micro-controller and/or other control circuitry as represented by the system control logic 560, or other analogous circuits that are used to control non-volatile memory.

Many different types of memory array architectures or memory technologies can be used to form memory structure 326. No particular non-volatile memory technology is required for purposes of the new claimed embodiments proposed herein. Other examples of suitable technologies for memory cells of the memory structure 502 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 502 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data using magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a programming current pulse. Note that the use of "pulse" in this document does not require a square pulse but includes a (continuous or non-continuous) vibration or burst of sound, current, voltage light, or other wave. Said memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5 can be grouped into two parts, the structure of memory structure 502 of the memory cells and the peripheral circuitry, including all of the other elements. An important characteristic of a memory circuit is its capacity, which can be increased by increasing the area of the memory die of memory system 500 that is given over to the memory structure 502; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 560, reduced availability of area can limit the available functionalities that can be implemented on-chip. Consequently, a basic trade-off in the design of a memory die for the memory system 500 is the amount of area to devote to the memory structure 502 and the amount of area to devote to the peripheral circuitry.

Another area in which the memory structure 502 and the peripheral circuitry are often at odds is in the processing involved in forming these regions, since these regions often involve differing processing technologies and the trade-off in having differing technologies on a single die. For example, when the memory structure 502 is NAND flash, this is an NMOS structure, while the peripheral circuitry is often CMOS based. For example, elements such sense amplifier circuits, charge pumps, logic elements in a state machine, and other peripheral circuitry in system control logic 560 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 502 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although illustrate for the example of a bonded memory circuit of one memory die and one peripheral circuitry die, other embodiments can use more die, such as two memory die and one peripheral circuitry die, for example.

FIGS. 6A and 6B shows an alternative arrangement to that of FIG. 5, which may be implemented using wafer-to-wafer bonding to provide a bonded die pair for memory system 600. FIG. 6A shows an example of the peripheral circuitry, including control circuits, formed in a peripheral circuit or control die 611 coupled to memory structure 602 formed in memory die 601. As with 502 of FIG. 5, the memory die 601 can include multiple independently accessible arrays or "tiles". Common components are labelled similarly to FIG. 5 (e.g., 502 is now 602, 510 is now 610, and so on). It can be seen that system control logic 660, row control circuitry 620, and column control circuitry 610 (which may be formed by a CMOS process) are located in control die 608. Additional elements, such as functionalities from controller 102, can also be moved into the control die 608. System control logic 660, row control circuitry 620, and column control circuitry 610 may be formed by a common process (e.g., CMOS process), so that adding elements and functionalities more typically found on a memory controller 102 may require few or no additional process steps (i.e., the same process steps used to fabricate controller 102 may also be used to fabricate system control logic 660, row control circuitry 620, and column control circuitry 610). Thus, while moving such circuits from a die such as memory die of memory system 500 may reduce the number of steps needed to fabricate such a die, adding such circuits to a die such as control die 611 may not require any additional process steps.

FIG. 6A shows column control circuitry 610 on the control die 611 coupled to memory structure 602 on the memory die 601 through electrical paths 606. For example, electrical paths 606 may provide electrical connection between column decoder 612, driver circuitry 614, and block select 616 and bit lines of memory structure 602. Electrical paths may extend from column control circuitry 610 in control die 611 through pads on control die 611 that are bonded to corresponding pads of the memory die 601, which are connected to bit lines of memory structure 602. Each bit line of memory structure 602 may have a corresponding electrical path in electrical paths 606, including a pair of bonded pads, that connects to column control circuitry 610. Similarly, row control circuitry 620, including row decoder 622, array drivers 624, and block select 626, are coupled to memory structure 602 through electrical paths 608. Each of electrical path 608 may correspond to a word line, dummy word line, or select gate line. Additional electrical paths may also be provided between control die 611 and memory die 601.

FIG. 6B is a block diagram showing more detail on the arrangement of one embodiment of the integrated memory assembly of bonded die pair 600. Memory die 601 contains a plane or array 602 of memory cells. The memory die 601 may have additional planes or arrays. One representative bit line (BL) and representative word line (WL) 666 is depicted for each plane or array 602. There may be thousands or tens of thousands of such bit lines per each plane or array 602. In one embodiment, an array or plane represents a groups of connected memory cells that share a common set of unbroken word lines and unbroken bit lines.

Control die 611 includes a number of bit line drivers 650. Each bit line driver 650 is connected to one bit line or may be connected to multiple bit lines in some embodiments. The control die 611 includes a number of word line drivers 660(1)-660(n). The word line drivers 660 are configured to provide voltages to word lines. In this example, there are "n" word lines per array or plane memory cells. If the memory operation is a program or read, one word line within the selected block is selected for the memory operation, in one embodiment. If the memory operation is an erase, all of the word lines within the selected block are selected for the erase, in one embodiment. The word line drivers 660 provide voltages to the word lines in memory die 601. As discussed above with respect to FIG. 6A, the control die 611 may also include charge pumps, voltage generators, and the like that are not represented in FIG. 6B, which may be used to provide voltages for the word line drivers 660 and/or the bit line drivers 650.

The memory die 601 has a number of bond pads 670a, 670b on a first major surface 682 of memory die 601. There may be "n" bond pads 670a, to receive voltages from a corresponding "n" word line drivers 660(1)-660(n). There may be one bond pad 670b for each bit line associated with array 602. The reference numeral 670 will be used to refer in general to bond pads on major surface 682.

In some embodiments, each data bit and each parity bit of a codeword are transferred through a different bond pad pair 670b, 674b. The bits of the codeword may be transferred in parallel over the bond pad pairs 670b, 674b. This provides for a very efficient data transfer relative to, for example, transferring data between the memory controller 102 and the integrated memory assembly 600. For example, the data bus between the memory controller 102 and the integrated memory assembly 600 may, for example, provide for eight, sixteen, or perhaps 32 bits to be transferred in parallel. However, the data bus between the memory controller 102 and the integrated memory assembly 600 is not limited to these examples. Such ECC may be implemented on the memory die in some embodiments.

The control die 611 has a number of bond pads 674a, 674b on a first major surface 684 of control die 611. There may be "n" bond pads 674a, to deliver voltages from a corresponding "n" word line drivers 660(1)-660(n) to memory die 601. There may be one bond pad 674b for each bit line associated with array 602. The reference numeral 674 will be used to refer in general to bond pads on major surface 682. Note that there may be bond pad pairs 670a/674a and bond pad pairs 670b/674b. In some embodiments, bond pads 670 and/or 674 are flip-chip bond pads.

In one embodiment, the pattern of bond pads 670 matches the pattern of bond pads 674. Bond pads 670 are bonded (e.g., flip chip bonded) to bond pads 674. Thus, the bond pads 670, 674 electrically and physically couple the memory die 601 to the control die 611. Also, the bond pads 670, 674 permit internal signal transfer between the memory die 601 and the control die 611. Thus, the memory die 601 and the control die 611 are bonded together with bond pads. Although FIG. 6A depicts one control die 611 bonded to one memory die 601, in another embodiment one control die 611 is bonded to multiple memory dies 601.

Herein, "internal signal transfer" means signal transfer between the control die 611 and the memory die 601. The internal signal transfer permits the circuitry on the control die 611 to control memory operations in the memory die 601. Therefore, the bond pads 670, 674 may be used for memory operation signal transfer. Herein, "memory operation signal transfer" refers to any signals that pertain to a memory operation in a memory die 601. A memory operation signal transfer could include, but is not limited to, providing a voltage, providing a current, receiving a voltage, receiving a current, sensing a voltage, and/or sensing a current.

The bond pads 670, 674 may be formed for example of copper, aluminum, and alloys thereof. There may be a liner between the bond pads 670, 674 and the major surfaces (682, 684). The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 670, 674. Several conductive pathways, which may be implemented with metal interconnects and/or vias are depicted. For example, a sense amplifier may be electrically connected to bond pad 674b by pathway 664. Relative to FIG. 6A, the electrical paths 606 can correspond to pathway 664, bond pads 674b, and bond pads 670b. There may be thousands of such sense amplifiers, pathways, and bond pads. Note that the BL does not necessarily make direct connection to bond pad 670b. The word line drivers 660 may be electrically connected to bond pads 674a by pathways 662. Relative to FIG. 6A, the electrical paths 608 can correspond to the pathway 662, the bond pads 674a, and bond pads 670a. Note that pathways 662 may comprise a separate conductive pathway for each word line driver 660(1)-660(n). Likewise, a there may be a separate bond pad 674a for each word line driver 660(1)-660(n). The word lines in block 2 of the memory die 601 may be electrically connected to bond pads 670a by pathways 664. In FIG. 6B, there are "n" pathways 664, for a corresponding "n" word lines in a block. There may be separate pair of bond pads 670a, 674a for each pathway 664.

Relative to FIG. 5, the on-die control circuits of FIG. 6A can also include addition functionalities within its logic elements, both more general capabilities than are typically found in the memory controller 102 and some CPU capabilities, but also application specific features.

In the following, system control logic 560/660, column control circuitry 510/610, row control circuitry 520/620, and/or controller 102 (or equivalently functioned circuits), in combination with all or a subset of the other circuits depicted in FIG. 5 or on the control die 611 in FIG. 6A and similar elements in FIG. 5, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In the following discussion, the memory array 502/602 of FIGS. 5 and 6A will mainly be discussed in the context of a cross-point architecture, although much of the discussion can be applied more generally. In a cross-point architecture, a first set of conductive lines or wires, such as word lines, run in a first direction relative to the underlying substrate and a second set of conductive lines or wires, such a bit lines, run in a second relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using MRAM memory cells. In particular, an exemplary embodiment uses a MRAM memory cells consisting of an MRAM memory element used in conjunction with a threshold switching selector.

FIG. 7A depicts one embodiment of a portion of a memory array that forms a cross-point architecture in an oblique view. Memory array 502/602 of FIG. 7A is one example of an implementation for memory array 502 in FIG. 5 or 602 in FIG. 6A, where a memory die can include multiple such array structures. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction. FIG. 7A is an example of a horizontal cross-point structure in which word lines $WL_1$-$WL_5$ and $BL_1$-$BL_5$ both run in a horizontal direction relative to the substrate, while the memory cells, two of which are indicated at 701, are oriented so that the current through a memory cell (such as shown at $I_{cell}$) runs in the vertical direction. In a memory array with additional layers of memory cells, such as discussed below with respect to FIG. 7D, there would be corresponding additional layers of bit lines and word lines.

As depicted in FIG. 7A, memory array 502/602 includes a plurality of memory cells 701. The memory cells 701 may include re-writeable memory cells, such as can be implemented using ReRAM, MRAM, PCM, FeRAM, or other material with a programmable resistance. The following discussion will focus on MRAM memory cells, although much of the discussion can be applied more generally. The current in the memory cells of the first memory level is shown as flowing upward as indicated by arrow Len, but current can flow in either direction, as is discussed in more detail in the following.

FIGS. 7B and 7C respectively present side and top views of the cross-point structure in FIG. 7A. The sideview of FIG. 7B shows one bottom wire, or word line, $WL_1$ and the top wires, or bit lines, $BL_1$-$BL_n$. At the cross-point between each top wire and bottom wire is an MRAM memory cell 1201, although PCM, FeRAM, ReRAM, or other technologies can be used. FIG. 7C is a top view illustrating the cross-point structure for M bottom wires $WL_1$-$WL_M$ and N top wires $BL_1$-$BL_N$. In a binary embodiment, the MRAM cell at each cross-point can be programmed into one of two resistance states: high and low. More detail on embodiments for an MRAM memory cell design and techniques for their programming are given below.

The cross-point array of FIG. 7A illustrates an embodiment with one layer of word lines and bits lines, with the MRAM or other memory cells sited at the intersection of the two sets of conducting lines. To increase the storage density of a memory die, multiple layers of such memory cells and conductive lines can be formed. A 2-layer example is illustrated in FIG. 7D.

FIG. 7D depicts an embodiment of a portion of a two level memory array that forms a cross-point architecture in an oblique view. As in FIG. 7A, FIG. 7D shows a first layer 718 of memory cells 701 of an array 502/602 connected at the cross-points of the first layer of word lines $WL_{1,1}$-$WL_{1,4}$ and bit lines $BL_1$-$BL_5$. A second layer of memory cells 720 is formed above the bit lines $BL_1$-$BL_5$ and between these bit lines and a second set of word lines $WL_{2,1}$-$WL_{2,4}$. Although FIG. 7D shows two layers, 718 and 720, of memory cells, the structure can be extended upward through additional alternating layers of word lines and bit lines. Depending on the embodiment, the word lines and bit lines of the array of FIG. 7D can be biased for read or program operations such that current in each layer flows from the word line layer to the bit line layer or the other way around. The two layers can be structured to have current flow in the same direction in each layer for a given operation, e.g., from bit line to word line for read, or to have current flow in the opposite directions, e.g., from word line to bit line for layer 1 read and from bit line to word line for layer 2 read.

The use of a cross-point architecture allows for arrays with a small footprint and several such arrays can be formed on a single die. The memory cells formed at each cross-point can a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used as the memory die 292 of FIG. 4, to replace local memory 106, or both. Resistive type memory cells can be formed according to many of the technologies mentioned above, such as ReRAM, FeRAM, PCM, or MRAM. The following discussion is presented mainly in the context of memory arrays using a cross-point architecture with binary valued MRAM memory cells, although much of the discussion is more generally applicable.

FIG. 8 illustrates an embodiment for the structure of an MRAM element of a memory cell, where, as described below, an MRAM base memory cell is typically formed of a programmable resistance MRAM element in series with a threshold switching selector. A voltage being applied across the MRAM element, between the corresponding word line and bit line, is represented as a voltage source $V_{app}$ 813. The MRAM element includes a bottom electrode 801, a pair of magnetic layers (reference layer 803 and free layer 807) separated by a separation or tunneling layer of, in this example, magnesium oxide (MgO) 805, and then a top electrode 811 separated from the free layer 807 by a spacer 809. The state of the MRAM element is based on the relative orientation of the magnetizations of the reference layer 803 and the free layer 807: if the two layers are magnetized in the same direction, the MRAM element will be in a parallel (P) low resistance state (LRS); and if they have the opposite orientation, the MRAM element will be in an anti-parallel (AP) high resistance state (HRS). An MLC embodiment would include additional intermediate states. The orientation of the reference layer 803 is fixed and, in the example of FIG. 15, is oriented upward. Reference layer 803 is also known as a fixed layer or pinned layer.

Data is written to an MRAM memory cell by programming the free layer 807 to either have the same orientation or opposite orientation. The reference layer 803 is formed so that it will maintain its orientation when programming the free layer 807. The reference layer 803 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the MRAM element.

FIG. 9 illustrates an embodiment for an MRAM element design as it would be implemented in a cross-point array in more detail. When placed in a cross-point array, the top and bottom electrodes of the MRAM element will be two of the adjacent layers of wires of the array, for example the top and bottom wires of the two level or two deck array. In the embodiment shown here, the bottom electrode is the word line 901 and the top electron is the bit line 911 of the memory cell, but these can be reversed in some embodiments by reversing the orientation of the memory element.

Between the word line 901 and bit line 911 are the reference layer 903 and free layer 907, which are again separated MgO barrier 905. In the embodiment shown in FIG. 9, a MgO cap 908 is also formed on top of the free layer 907 and a conductive spacer 909 is formed between the bit line 911 and the MgO cap 908. The reference layer 903 is separated from the word line 901 by another conductive spacer 902. On either side of the MRAM element structure is a liner 921 and 923, where these can be part of the same structure, but appear separate in the cross-section of FIG. 9. To either side of the liner 921, 923 is shown some of fill material 925, 927 used to fill in the otherwise empty regions of the cross-point structure.

With respect to the free layer design 907, embodiments include CoFe or CoFeB Alloy with a thickness on the order ~1-2 nm, where an Ir layer can be interspersed in the free layer close to MgO barrier 905 and the free layer 907 can be doped with Ta, W, or Mo. Embodiments for the reference layer 903 can include a bilayer of CoFeB and CoPt multilayer coupled with an Ir or Ru spacer 902. The MgO cap 908 is optional, but can be used to increase anisotropy of free layer 907. The conductive spacers can be conductive metals such as Ta, W, Ru, CN, TiN, and TaN, among others.

To sense a data state stored in an MRAM, a voltage is applied across the memory cell as represented by $V_{app}$ to determine its resistance state. For reading an MRAM memory cell, the voltage differential $V_{app}$ can be applied in either direction; however, MRAM elements have a directionality and, because of this, in some circumstances there is a preference for reading in one direction over the other. For example, the optimum current amplitude to write a bit into the AP (high resistance state, HRS) may be greater than that to write to the P (low resistance state) by 50% or more, so bit error rate (read disturb) is less probable if reading to AP (2AP). Some of these circumstances and the resultant directionality of a read are discussed below. The directionality of the biasing particularly enters into some embodiments for the programming of MRAM memory cells, as is discussed further with respect to FIGS. 10A and 10B.

The following discussion will mainly be discussed with respect to a perpendicular spin transfer torque MRAM memory cell, where the free layer 807/907 of FIGS. 8 and 9 comprises a switchable direction of magnetization that is perpendicular to the plane of the free layer. Spin transfer torque ("STT") is an effect in which the orientation of a magnetic layer in a magnetic tunnel junction can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (the reference layer), a spin-polarized current can be produced. If this spin-polarized current is directed into a second magnetic layer (the free layer), angular momentum can be transferred to this second magnetic layer, changing the direction of magnetization of the second magnetic layer. This is referred to as spin transfer torque. FIGS. 10A and 10B illustrate the used of spin transfer torque to program or write to MRAM memory. Spin transfer torque magnetic random access memory (STT MRAM) has the advantages of lower power consumption and better scalability over MRAM variations such as toggle MRAM. Compared to other MRAM implementations, the STT switching technique requires relatively low power, virtually eliminates the problem of adjacent bit disturbs, and has more favorable scaling for higher memory cell densities (reduced MRAM cell size). The latter issue also favors STT MRAM where the free and reference layer magnetizations are orientated perpendicular to the film plane, rather than in-plane.

As the STT phenomenon is more easily described in terms of electron behavior, FIGS. 10A and 10B and their discussion are given in terms of electron current, where the direction of the write current is defined as the direction of the electron flow. Therefore, the term write current in reference to FIGS. 10A and 10B refers to an electron current. As electrons are negatively charged, the electron current will be in the opposite direction from the conventionally defined current, so that an electron current will flow from a lower voltage level towards a higher voltage level instead the conventional current flow of from a higher voltage level to a lower voltage level.

FIGS. 10A and 10B illustrate the writing of an MRAM memory cell by use a the STT mechanism, depicting a simplified schematic representation of an example of an STT-switching MRAM memory cell 1000 in which both the reference and free layer magnetization are in the perpendicular direction. Memory cell 1000 includes a magnetic tunnel junction (MTJ) 1002 comprising an upper ferromagnetic layer 1010, a lower ferromagnetic layer 1012, and a tunnel barrier (TB) 1014 as an insulating layer between the two ferromagnetic layers. In this example, upper ferromagnetic layer 1010 is the free layer FL and the direction of its magnetization can be switched. Lower ferromagnetic layer 1012 is the reference (or fixed) layer RL and the direction of its magnetization cannot be switched. When the magnetization in free layer 1010 is parallel to the magnetization in reference layer RL 1012, the resistance across the memory cell 1000 is relatively low. When the magnetization in free layer FL 1010 is anti-parallel to the magnetization in reference layer RL 1012, the resistance across memory cell 1000 is relatively high. The data ("0" or "1") in memory cell 1000 is read by measuring the resistance of the memory cell 1000. In this regard, electrical conductors 1006/1008 attached to memory cell 1000 are utilized to read the MRAM data. By design, both the parallel and antiparallel configurations remain stable in the quiescent state and/or during a read operation (at sufficiently low read current).

For both the reference layer RL 1012 and free layer FL 1010, the direction of magnetization is in a perpendicular direction (i.e., perpendicular to the plane defined by the free layer and perpendicular to the plane defined by the reference layer). FIGS. 10A and 10B show the direction of magnetization of reference layer RL 1012 as up and the direction of magnetization of free layer FL 1010 as switchable between up and down, which is again perpendicular to the plane.

In one embodiment, tunnel barrier 1014 is made of Magnesium Oxide (MgO); however, other materials can also be used. Free layer 1010 is a ferromagnetic metal that possess the ability to change/switch its direction of magnetization. Multilayers based on transition metals like Co, Fe and their alloys can be used to form free layer 1010. In one embodiment, free layer 1010 comprises an alloy of Cobalt, Iron and Boron. Reference layer 1012 can be many different types of materials including (but not limited to) multiple layers of Cobalt and Platinum and/or an alloy of Cobalt and Iron.

To "set" the MRAM memory cell bit value (i.e., choose the direction of the free layer magnetization), an electron write current 1050 is applied from conductor 1008 to conductor 1006, as depicted in FIG. 10A. To generate the electron write current 1050, the top conductor 1006 is place at a higher voltage level than bottom conductor 1008, due the negative charge of the electron. The electrons in the electron write current 1050 become spin-polarized as they pass through reference layer 1012 because reference layer 1012 is a ferromagnetic metal. When the spin-polarized electrons tunnel across the tunnel barrier 1014, conservation of angular momentum can result in the imparting of a spin transfer torque on both free layer 1010 and reference layer 1012, but this torque is inadequate (by design) to affect the magnetization direction of the reference layer 1012. Contrastingly, this spin transfer torque is (by design) sufficient to switch the magnetization orientation in the free layer 1010 to become parallel (P) to that of the reference layer 1012 if the initial magnetization orientation of the free layer 1010 was anti-parallel (AP) to the reference layer 1012, referred to as an anti-parallel-to-parallel (AP2P) write. The parallel magnetizations will then remain stable before and after such electron write current is turned off.

In contrast, if free layer 1010 and reference layer 1012 magnetizations are initially parallel, the direction of magnetization of free layer 1010 can be switched to become antiparallel to the reference layer 1012 by application of an electron write current of opposite direction to the aforementioned case. For example, electron write current 1052 is applied from conductor 1006 to conductor 1008, as depicted in FIG. 10B, by placing the higher voltage level on the lower conductor 1008. This will write a free layer 1010 in a P state to an AP state, referred to as a parallel-to-anti-parallel (P2AP) write. Thus, by way of the same STT physics, the direction of the magnetization of free layer 1010 can be deterministically set into either of two stable orientations by judicious choice of the electron write current direction (polarity).

The data ("0" or "1") in memory cell 1000 can be read by measuring the resistance of the memory cell 1000. Low resistance typically represents a "0" bit and high resistance typically represents a "1" bit, although sometimes the alternate convention occurs. A read current can be applied across the memory cell (e.g., across the magnetic tunnel junction 1002) by applying an electron read current from conductor 1008 to conductor 1006, flowing as shown for 1050 in FIG. 10A (the "AP2P direction"); alternatively, the electron read current can be applied from conductor 1006 to conductor 1008, flowing as shown for 1052 in Figure (the "P2AP direction"). In a read operation, if the electron write current is too high, this can disturb data stored in a memory cell and change its state. For example, if electron read current uses the P2AP direction of FIG. 10B, too high of a current or voltage level can switch any memory cells in the low resistance P state into the high resistance AP state. Consequently, although the MRAM memory cell can be read in either direction, the directional nature of the write operation may make one read direction preferable over the other in various embodiments as the P2AP direction since more current is required to write the bit in that direction.

Although the discussion of FIGS. 10A and 10B was in the context of electron current for the read and write currents, the subsequent discussion will be in the context of conventional current unless otherwise specified.

Whether to read or write selected memory cells in the array structures of FIGS. 7A-7D, the bit line and word line corresponding a selected is biased to place a voltage across the selected memory cell and induce the flow of electrons as illustrated with respect to FIG. 10A or 10B. This will also apply a voltage across non-selected memory cells of the array, which can induce currents in non-selected memory cells. Although this wasted power consumption can be mitigated to some degree by designing the memory cells to have relatively high resistance levels for both high and low resistance states, this will still result in increased current and power consumption as well as placing additional design constraints on the design of the memory cells and the array.

One approach to address this unwanted current leakage is to place a selector element in series with each MRAM or other resistive (e.g., ReRAM, PCM, and FeRAM) memory cell. For example, a select transistor can be placed in series with each resistive memory cell element in FIGS. 7A-7D so that the elements 701 are now a composite of a selector and a programmable resistance. Use of a transistor, however, requires the introduction of additional control lines to be able to turn on the corresponding transistor of a selected memory cell. Additionally, transistors will often not scale in the same manner as the resistive memory element, so that as memory arrays move to smaller sizes the use of transistor based selectors can be a limiting factor.

An alternate approach to selector elements is the use of a threshold switching selector device in series with the programmable resistive element. A threshold switching selector has a high resistance (in an off or non-conductive state) when it is biased to a voltage lower than its threshold voltage, and a low resistance (in an on or conductive state) when it is biased to a voltage higher than its threshold voltage. The threshold switching selector remains on until its current is lowered below a holding current, or the voltage is lowered below a holding voltage. When this occurs, the threshold switching selector returns to the off state. Accordingly, to program a memory cell at a cross-point, a voltage or current is applied which is sufficient to turn on the associated threshold switching selector and set or reset the memory cell; and to read a memory cell, the threshold switching selector similarly must be activated by being turned on before the resistance state of the memory cell can be determined. One set of examples for a threshold switching selector is an ovonic threshold switching material of an Ovonic Threshold Switch (OTS).

FIGS. 11A and 11B illustrate embodiments for the incorporation of threshold switching selectors into an MRAM memory array having a cross-point architecture. The examples of FIGS. 11A and 11B show two MRAM cells in a two layer cross-point array, such as shown in FIG. 7D, but in a side view. FIGS. 11A and 11B show a lower first conducting line of word line 1 1100, an upper first conducting line of word line 2 1120, and an intermediate second conducting line of bit line 1110. In these figures, all of these lines are shown running left to right across the page for ease of presentation, by in a cross-point array they would be more accurately represented as represented in the oblique view of FIG. 7D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIG. 9.

An MRAM cell 1102 including free layer 1101, tunnel barrier 1103, and reference layer 1105 is formed above the threshold switching selector 1109, where this series combination of the MRAM device 1102 and the threshold switching selector 1109 together form the layer 1 cell between the bit line 1110 and word line 1 1100. The series combination of the MRAM device 1102 and the threshold switching selector 1109 operate as largely as described above with respect to FIGS. 10A and 10B when the threshold switching selector 1109 is turned on, aside from some voltage drop across the threshold switching selector 1109. Initially, though, the threshold switching selector 1109 needs to be turned on by applying a voltage above the threshold voltage Vth of the threshold switching selector 1109, and then the biasing current or voltage needs to be maintained high enough above the holding current or holding voltage of the threshold switching selector 1109 so that it stays on during the subsequent read or write operation.

On the second layer, an MRAM cell 1112 includes free layer 1111, tunnel barrier 1113, and reference layer 1115 is formed above the threshold switching selector 1119, with the series combination of the MRAM device 1112 and the threshold switching selector 1119 together forming the layer 2 cell between the bit line 1110 and word line 2 1120. The layer 2 cell will operate as for the layer 1 cell, although the lower conductor now corresponds to a bit line 1110 and the upper conductor is now a word line, word line 2 1120.

In the embodiment of FIG. 11A, the threshold switching selector 1109/1119 is formed below the MRAM device 1102/1112, but in alternate embodiments the threshold switching selector can be formed above the MRAM device for one or both layers. As discussed with respect to FIGS. 10A and 10B, the MRAM memory cell is directional. In FIG. 11A, the MRAM devices 1102 and 1112 have the same orientation, with the free layer 1101/1111 above (relative to the unshown substrate) the reference layer 1105/1115. Forming the layers between the conductive lines with the same structure can have a number of advantages, particularly with respect to processing as each of the two layers, as well as subsequent layers in embodiments with more layers, can be formed according to the same processing sequence.

FIG. 11B illustrates an alternate embodiment that is arranged similarly to that of FIG. 11A, except that in the layer 2 cell the locations of the reference layer and free layer are reversed. More specifically, between word line 1 1150 and bit line 1160, as in FIG. 11A the layer cell 1 includes an MRAM structure 1152 having a free layer 1151 formed over tunnel barrier 1153, that is turn formed over the reference layer 1155, with the MRAM structure 1152 formed over the threshold switching selector 1159. The second layer of the embodiment of FIG. 11B again has an MRAM device 1162 formed over a threshold switching selector 1169 between the bit line 1160 and word line 2 1170, but, relative to FIG. 11A, with the MRAM device 1162 inverted, having the reference layer 1161 now formed above the tunnel barrier 1163 and the free layer 1165 now under the tunnel barrier 1163.

Although the embodiment of FIG. 11B requires a different processing sequence for the forming of layers, in some embodiments it can have advantages. In particular, the directionality of the MRAM structure can make the embodiment of FIG. 11B attractive since when writing or reading in the same direction (with respect to the reference and free layers) the bit line will be biased the same for both the lower layer and the upper layer, and both word lines will be biased the same. For example, if both layer 1 and layer 2 memory cells are sensed in the P2AP direction (with respect to the reference and free layers), the bit line layer 1160 will be biased such as in the P2AP direction, the bit line 1160 is biased low (e.g., 0V) for both the upper and lower cell, with word line 1 1150 and word line 2 1170 both biased to a higher voltage level. Similarly, with respect to writing, for writing to the high resistance AP state the bit line 1160 is biased low (e.g., 0V) for both the upper and lower cell, with word line 1 1150 and word line 2 1170 both biased to a higher voltage level; and for writing to the low resistance P state the bit line 1160 is biased to the high voltage level, with word line 1 1150 and word line 2 1170 both biased to the low voltage level. In contrast, for the embodiment of FIG. 11A, the bit lines and word lines would need to have their bias levels reversed for performing any of these operations on the upper level relative to the lower level.

The memory cells of non-volatile memory devices, such as those based on flash memory, PCM, ReRAM, or, the main example used here, MRAM, experience wear as they are repeatedly written, read, and erased. As such, these cells have a finite lifetime. This lifetime varies based upon the technology as well as the particular design and processing parameters for the device, but for many applications frequently accessed memory cells will often wear out. As a host storing data on a such a device will typically rewrite data at some logical addresses much more often than other logical addresses, this can lead to uneven wear across the memory device. To even out wear across the device's memory cells, wear levelling can be used, where rather than repeatedly assign a logical address to the same physical address on a memory, the logical to physical correspondence of memory addresses is varied to enhance the longevity of the memory device.

Another concern with data stored on a non-volatile memory device is the security of the data both when stored and when being transferred. One way to address this is to encrypt the data, such as by use of an Advanced Encryption Standard (AES), where the data is encrypted before being transferred from the memory controller and written to the memory device and, the data is decrypted when provided back to a device enabled with the corresponding decryption information. Although this provides one layer of security, providing sufficiently robust security is an increasing concern.

The following presents wear levelling techniques based on use of a Galois field for the logical to physical translation of data addresses. This not only provides a wear levelling technique to extend memory life, but also adds an additional layer of security to the stored memory data. Although the following discussion is presented in the context MRAM-based memory, these techniques can be applied more generally to other types of memory devices.

More specifically, the following presents embodiments for secure wear levelling based on a Galois field having an order based on the size of the memory. A Galois field, or finite field, is field (in the abstract algebra sense) over a finite number of elements (the "order" of the field) and is designated as GF(p), where p is the order of the field and all finite fields of a given order are isometric. Such fields find application in error correction codes (ECC), such as BCH ECC, and also in data encryption, such as in AES standards. The embodiments presented here apply Galois fields to a secure logical address wear levelling technique, where each of these uses of a Galois field the is independent of and complementary to these other uses. To illustrate these differing uses, in the examples below Galois fields of different orders can used for each of these purposes. Although the orders of the Galois fields will depend on the specific embodiment, the following will use $GF(2^{12})$ for secure logical address wear levelling of a 2 Gb MRAM memory, $GF(2^{10})$ for high speed (i.e., non-clocked) BCH ECC decoding, and $GF(2^8)$ for data encoding. As discussed in more detail below, the size of the Galois field for secure logical address wear levelling is based on the embodiment used for the physical memory structure, where, in the example embodiment, the size of the Galois field $GF(2^n)$ chosen for secure wear levelling is determined as the smallest "2^(2*n)" approximation to the number of 256b-addresses in the MRAM-Bank. The size of the Galois field used for ECC and the size of Galois field used for data encoding are both independently determined based ECC and encryption respectively based on the selected level of ECC and encryption.

FIG. 12 is a block diagram for some elements of an embodiment for a memory controller that can include secure wear levelling using a Galois field having a size based on the memory structure. To help distinguish the different uses of a Galois field described in the preceding paragraph, FIG. 12 includes a block for each of those uses. More specifically, FIG. 12 illustrates a memory controller circuit MCC 1200 that includes a wear management block 1210, a security block 1220, an error correction block 1250, and a sequencer block 1240. These elements can correspond to the elements, and in particular back end elements, of FIGS. 2 and 3, but represented here to highlight features relevant to this discussion.

In FIG. 12, MCC 1200 receives read addresses in a FIFO 1204, write addresses in a FIFO 1205, and write data in a FIFO 1206. The data can be from a host 120 or data management data generated on controller 102 and the addresses are logical addresses. A FIFO 1208 can provide read data and a FIFO 1207 can provide redundancy data (br). The wear management block 1210 receives both the read and write address and maintains tables 1213 that can include both the wear management tables and a table of bad blocks of the memory. In particular, the tables can hold look up tables (LUTs) for use in the combined wear leveling/address encryption process, as described in more detail below with respect to FIG. 14 and subsequent figures. Based on the table values, the circuitry of block 1211 can perform address encryption using the tables 1213, address calculation (i.e., logical to physical conversion), and wear levelling for the read and write addresses. The resultant physical read and write addresses can then be respectively stored in the FIFOs 1241 and 1242. The dotted vertical line running thought the FIFOs 1241, 1242, and the other elements represented under them represent the different clock regimes, where to the left the logic and other circuitry runs on the controller clock rate and the logic and other circuitry on the right runs on the memory device clock rate, which may differ or be the same based on the embodiment. The wear management block 1210 and its Galois field based wear levelling circuitry are discussed in more detail below with respect to FIG. 14 and later figures that present a Galois field indexed two-dimensional (line, block) addressing system for arbitrary MRAM bank size.

The security block 1220 performs encryption of data to be written and decoding of read data, such as based using a Galois field. Write data is received from FIFO 1206 at encryption block, along with the write addresses from FIFO 1205. The encryption block 1221 can then generate parity check bits for the write data, perform encryption (such as AES encryption) and encryption checking, with the encrypted write data stored in FIFO 1243. The FIFO 1244 can receive translation ID data on the encrypted data from FIFO 1243, which can then provide the redundancy bit values to FIFO 1207. The logic circuitry of the decryption block 1223 receives the read encrypted data from FIFO 1245 and generates read data parity bits and decodes the read data, which can then be stored in FIFO 1208.

The ECC block 1250 generates ECC code in the ECC generator block 1251 for the (encoded) write data received from FIFO 1243 and generates the corresponding ECC data, such as by a BCH12 algorithm, with the write data and corresponding ECC data then provided to the memory to be written at the corresponding physical address. For ECC decoding, the process is reversed by receiving ECC code words from the physical address, decoding these in the ECC check block 1253, and storing the result into FIFO 1245.

The various FIFOs 1241-1245 can be part of the sequencer circuitry for transmitting to the MRAM memory die or dies and can use a double data rate (DDR) interface. The physical read and write addresses from the FIFOs 1241 and 1242 are received at a multiplexing circuit MUX 1246, from which they can be loaded in the command queue 1248 for transmission to the MRAM memory based on the input from the media sequencer 1247 that is in communication with the MRAM memory to exchange physical control signals. The output of the command queue can also be entered into an issued command buffer 1249 and fed back into MUX 1246 and FIFO 1245. The MCC circuit 1200 can also include other elements, such as can access the memory die for their physical management, such a physical utility access block 1203 that can manage the memory based on MCC parameters stored in control/status registers 1201.

The order of the Galois field used in the wear levelling process is selected based on the size and structure of the memory bank for which it is used. The following will use a 2 Gb MRAM memory bank example having a structure illustrated with respect to FIG. 13.

FIG. 13 illustrates features of a 2 Gb MRAM memory bank embodiment for which Galois field secure wear levelling can be used. The embodiment of FIG. 13 includes both a data portion and a check bit portion. The bank is formed of modules of MRAM cells, where each module has four sub-arrays, or "tiles", labelled A, B, C, D. In each module, the tiles are separated by column decoder circuitry, indicated by the vertical broken line in each module, and vias connecting to word lines of other planes, indicated by the horizontal broken line in each module. The embodiment of FIG. 13 has eight "stripes" (the vertical columns, as represented in the figure) of modules that are grouped into pairs, with one stripe of the pair to either side of data input/output (DATA IO) wires that connect sense amplifiers and other row and/or column control circuitry as illustrated in FIGS. 5 and 6A. In each pair of stripes, the relative positions of tile A and tile C, and tile B and tile D, are reversed, so that tile A and tile B are adjacent to the DATA IO wires of each pair of stripes. FIG. 13 also illustrates an example of a selected bit line, running across the A and C tiles, and an example of a selected word line, running vertically across the A and B tiles, so that an access selects one bit from each module of 4 tiles. The order of the Galois field used for secure wear levelling is based on the number of tiles used to store the data bits and, more specifically, the number of bits used in addressing the memory cells. In the data partition, the data bits are stored in 8 stripes, 32 modules in each strip (for 256 modules), and 4 tiles per module, for 1024 tiles.

In addition to the data bit partition, the embodiment of FIG. 13 also includes a check bit partition. In this example, the check bits are stored in the 8 stripes, with 8 modules per stripe and 4 tile per module, for 256 tiles. For 9 bit ECC, there are 81 check bits for each 256 data bits, so that the $64^{th}$ check bit module is optional and can be deleted, if desired, to provide more space for logic circuitry. The positions shown for the check bit modules and the data bit module are just an example embodiment and arranged as shown for explanatory purposes, but more generally can be located anywhere within the partitions. Additionally, in terms of the number of memory dies for the modules, the techniques for secure Galois field based wear levelling presented here can be used for any arrangement from one die for all the modules to one die per module.

The following discussion will be based on this 2 Gb MRAM bank using the Galois field $GF(2^{12})$ for 24 bit addressing based on the 8 stripe, 32 module per stripe, 4 tile (i.e., A, B, C, D) per module embodiment of FIG. 13. A given data access (i.e., read or write) selects one bit from each four tile module across the 8 stripes of 32 modules, resulting in 256 bits of data. Within a 2 Gb bank of memory cells, there are $N=(2*10^9)/256=7,812,500$ locations of 256 bits, so that Galois field addressing can be done with log $2(N)=23$ bits, where the following uses a 24 bit memory address for convenience, where the 24 bit address is split into a 12 bit write line and a 12 block location within a 2 Gb partition of $2^{12}$ write lines per block and $2^{12}$ blocks. Consequently, 99.98% of a 2 Gb MRAM partition can be fit into the prime number of p=1907 blocks of 4095 memory lines (of 256 bit blocks each) to address the blocks by a Galois field of GF(p).

As will now be described further, for the example memory structure presented above, embodiments of secure wear levelling are based on a Galois Field and use a randomly masked secure-block cipher that encrypts the MRAM bank wear levelled logical addresses prior to transmission over the memory bus, where the Galois field based randomly masked secure-block cipher decryption circuitry can reside inside the MRAM bank. FIG. 14 provides move detail on the wear management block 1210 of FIG. 12, employing logical to physical address LUTs for both the block address and the line address to provide a combined encryption, wear levelling process on the memory controller, with corresponding physical to logical LUTs on the memory module for decryption. This renders the logical address traffic across the memory bus to be opaque to malicious "eavesdropping" on the memory bus, as a result of which the memory-host communications are rendered immune to such an attack. More specifically, the block diagram of FIG. 14 describes an embodiment for the logical address secure wear leveling encryption process, where, in addition, Galois field arithmetic is used to reduce the complexity of storing the MRAM bank wear leveling state by using a Galois field-[Line, Block]-address indexing scheme, as well as to provide a simple Galois field-[Line, Block] state transition implementation of a "Start-Gap" module, which can introduce skipped lines in the address conversion procedure.

For an embodiment based on the 24 bit address is split into a 12 bit write line and a 12 block location within a 2 Gb partition of $2^{12}$ write lines per block and $2^{12}$ blocks example, a $GF(2^{12})$ logical address [12b block, 12b line]-log lookup tables are used. The state storage and state transition values for word lines can be stored in, for example, SRAM memory, again as [12b block, 12b line] $GF(2^{12})$ values. If the 12 bit addresses are represented as vectors, a representation of elements of $GF(2^{12})$ as 12×12 matrices can be used, so that operating an address with an element of $GF(2^{12})$ is just a multiplication of the matrix with the address vector that will generate a rotated address.

FIG. 14 is block diagram of a secure dynamic wear levelling system illustrating the path for host addresses to a memory module. For the example embodiment, a 24 bit logical address is received from a host and buffered in circuit 1401, such as a FIFO, and split into a 12 bit block address and a 12 bit line address that are then propagated through the secure wear levelling and logical to physical translation elements, with the corresponding 12 bit physical block address and 12 bit physical line address being stored in the physical address buffer 1431, such as a FIFO, before being transmitted to the memory module 1450. As above, this example uses an MRAM memory module, but in other embodiments this could be PCM, ReRAM, or other memory technology. More generally, the address can be broken into more sub-addresses or kept as a single component, where the order of the Galois field used for each can be the same as the number of bits N in the address, $GF(2^N)$.

Considering the logical block address, this is received from the host address buffer 1401 at the look up table for blocks, Log[B] LUT 1403, to undergo a $GF(2^{12})$ translation for secure wear levelling, followed by a random rotation at 1421, and then a combined encryption/wear levelling logical to physical address translation in LA to PA[B] LUT 1423, with the resultant physical block address stored in buffer 1431. The line address follows a similar path, undergoing a $GF(2^{12})$ translation for secure wear levelling at Log[L] LUT 1405, followed by a random rotation at 1415, and then a combined encryption/wear levelling logical to physical address translation in LA to PA[L] LUT 1417, with the resultant physical line address stored in buffer 1431. Relative to the block address path, the line address path includes some additional elements. As the effects of the Log[B] LUT 1403 on the blocks will also affect the word lines, an SRAM 1407 or similar memory in used to store the 12b word line indices of the block, where these can be compared to the output of the Log[L] LUT 1405 in the index comparison block 1411 and adjusted. Once this is done, in some embodiments a start gap scheme can be implemented at block 1413 to generate the line index value that then undergoes the random rotation at 1415.

Once the block and line components of a physical address are in the buffer 1431, they can be transferred to the physical interface, such as a DDR interface 1433, and transferred over the DDR memory bus 1461 and received at the DDR physical interface 1451 on the memory module 1450. On the MRAM module 1450, the random rotations for the block and line addresses respectively performed at 1421 and 1415 are inverted. From the DDR physical interface DDR 1451, the block and line addresses are separated, with the block addresses going to the inverse combined decryption/wear levelling physical to logical conversion LUT 1452 for blocks, followed by the rotation inverse 1454 to undo the random rotation 1421, after which it is stored in the physical address buffer 1457. The line addresses undergoes a similar process at combined decryption/wear levelling PA to LA[L] LUT 1453 and address rotation inverse 1455 before being stored in buffer 1457. Once both the block and line portions of the physical address are in the buffer, they can then be supplied on to the internal MRAM structures 1459 for accessing the memory for a data write or read, such as described above in FIGS. 1-11B.

Considering these elements further, the wear level state can be defined for all MRAM partition blocks, where the wear level state of the example 2 Gb MRAM bank is $(2*2^9)/256=7,812,500$ memory line addresses partition into M=1907 blocks with 4096 lines/block would use an SRAM 1407 with storage of 1907*12=12,844 bits. The look up tables 1403 and 1405 provide a cyclic logical address 12 bit block address index and a logical address 12 bit line address index, where the Log[B] LUT 1403 provides input into SRAM 1407 to locate the last sequential memory line address in any block, which can then be used by the logical address comparator logic of index comparator 1411. The start gap module 1413 can also use a cyclic word line address shift implemented by a $GF(2^{12})$ cyclic group rotation. The 2D "S-box" LUTs of the address random rotation blocks 1421, 1415 for the block and line random address rotations can provide up to a $2^{48}$ address ambiguity by use of random $GF(2^{12})$ random address rotation masks, which can be precalculated.

FIGS. 15-19 provide an example of the recursive $GF(2^{12})$ random matrix mask calculation, which can be precalculated in an offline mode. As noted before, the order of the Galois field depends on the address size, where the current example uses 12 bits for both the line and block addresses, and where, more generally, N bits would use GF(2 N). FIG. 15 is an example of a 12×12 Boolean matrix multiplicative generator T12 of $GF(2^{12})$. The entries are either 0s or 1s and act on a 12 bit input binary vector of the input address to generate the output of the rotation as a 12 bit binary vector. FIG. 16 gives a general input matrix I12, where each line corresponds to a row of Boolean input values, such as [i1, i2, . . . , i12] for the first row and so one for the next 11 lines of 12 input values. Performing the matrix multiplication between I12 and T12 to determine the output matrix O12: =I12*T12 yields the result of FIG. 17, where the notation is [in, out], so that for the first element, for example [i1, i2] indicates i1 is rotated to i2, and so on for the other elements. In each clock cycle, the generator T12 is multiplied with the current rotation matrix, so that after K clock cycles, the rotation matrix will be $(T12)^K$. FIG. 18 illustrates the example of the random rotation matrix T37 based on generator T12 after 37 clock cycles, $T37=(T12)^{37}$. Under the random rotation matrix T37 is shown an example 12 bit input address b12 and the resultant randomly T37 rotated address b12*T37. FIG. 19 looks at the more general case where a 12 bit input address b12 is multiplied by a general 12×12 matrix I12 to generate the 12 output equations of rows o1-o12 of the matrix o12=b12*I12, such as can be used for a logical address 12 bit vector multiplication by the accumulated $GF(2^{12})$ rotation mask logic in an offline mode.

FIGS. 20-22 present an embodiment for the random address rotation circuitry, where FIG. 20 is a circuit to generate a random address rotation and its inverse for a given address from initial random values. FIGS. 21 and 22 provide more detail of portions of Figure Relative to FIG. 14, these elements can correspond to the address random rotation blocks 1421, 1415 and address random rotation inverse blocks 1454, 1455. A first randomized value randomize[0] is generated in a first random address initialization block 2010 and a second randomized value randomize[1] is generated in a second random address initialization block 2020, which both begin an initialization process in response to a start initiation signal. Each of 2010 and 2020 include a corresponding set of 12 flip-flops to receive and store a 12 bit random value rand val 0 and rand val 1, respectively, and also a corresponding set of 12 flip-flops to store a counter value. The comparators 2015, 2025 then compare the count value from 2011, 2021 with the random values from 2013, 2023 to generate corresponding values randomize[0], randomize[1]. Both of randomize[0] and randomize[1] are supplied to the random address generation block 2001 and the random address generation block 2003. The random address generation block 2001 also receives an input address (not shown in FIG. 20) and then uses randomize[0] and randomize[1] to randomize this input address. Similarly, the random address inverse generation block 2003 receives an input address (not shown in Figure and then uses randomize[0] and randomize[1] to undo the randomization of this input address. Since, for this $GF(2^{12})$ example, the combined input and output 12 bit address rotations give an address ambiguity of $2^{24}$, which applied to both the line and block addresses gives an address ambiguity of $2^{48}$.

FIG. 21 presents more detail on an embodiment for the random address generation block rand addr 2001 of FIG. 20. FIG. 21 receives a 24 bit input address in this example, corresponding to the combined 12 bit block address and 12 bit line address, so that FIG. 21 corresponds to both of the address rotation blocks 1421 and 1415 of FIG. 14. The received 24 bit address_i is received at a FIFO 2101 and provided to the multiplexer 2103 that can provide a randomization rotation bypass in response to a bypass control signal for cases when randomization is not being used, in which case the input address is transferred to the output FIFO 2105 to provide a 24 output address addr_o that is the same as addr_i. When bypass is not asserted, the rotated address will instead be loaded by the MUX 2103 into the output buffer 2105. In some embodiments, one or both of FIFO 2101 and FIFO 2105 can be omitted.

To perform the random rotation, the 24 address buffered in the input FIFO 2101 is split into a lower 12 bits (i.e., block address) and an upper 12 bits (i.e., line address). Considering the lower 12 bit address, a matrix/counter block 2110 generates a 12×12 rotation matrix for multiplication with the 12 bit address vector in multiplication logic block 2117. To generate the rotation matrix matrix/counter block 2110 receives bits randomize_i[0] from block 2010 of FIG. 20 and also an initial state 2115 at the counter 2111 of 144 flip-flops to generate a rotation matrix of matrix forward 2113, which is re-multiplied by the $GF(2^{12})$ generator at each clock count, as described above with respect to FIGS. 15-19. The counter 2111 can then provide the current rotation matrix to the multiplication block 2117.

Similarly, for the upper 12 bit address (i.e., line address), a matrix/counter block 2120 generates a 12×12 rotation matrix for multiplication with the 12 bit address vector in multiplication logic block 2127. To generate the rotation matrix matrix/counter block 2120 receives bits randomize_i[1] from block 2020 of FIG. 20 and also an initial state 2125 at the counter 2121 of 144 flip-flops to generate a rotation matrix of matrix forward 2123, which is re-multiplied by the $GF(2^{12})$ generator at each clock count. The counter 2121 can then provide the current rotation matrix to the multiplication block 2127.

Once the lower and upper 12 bits of the address are rotated at respective multiplication blocks 2117 and 2127, they can undergo logical to physical address translation by use of a 12×12 matrix $GF(2^{12})$ LUT. Relative to FIG. 14, the output of multiplier 2117 can correspond to that from address random rotation 1421 and the output of multiplier 2127 can correspond to that from address random rotation 1415. The LUT 2119 can correspond to LA to PA[B] LUT 1423 for a combined encryption/wear levelling on blocks and LUT 2129 can correspond to LA to PA[L] LUT 1417 for a combined encryption/wear levelling on lines, with the FIFO corresponding to physical address buffer 1431.

FIG. 22 is organized similarly to FIG. 21 and with elements similarly numbered (e.g., input address buffer 2101 of FIG. 21 is now 2201, and so on). Referring back to FIG. 14, for the lower 12 address bits or block address, LUT 2219 can correspond to PA to LA[B] LUT 1452 for the combined decryption/wear levelling on lines, as the physical address is converted back to the logical address prior to the addresses inverse rotation 1454 that can correspond to the elements in the upper portion of rand addr inv 2003. For the upper 12 address bits or line address, LUT 2229 can correspond to PA to LA[L] LUT 1453 for the combined decryption/wear levelling on lines, as the physical line address is also converted back to the logical address prior to the addresses inverse rotation 1455 that can correspond to the elements in the lower portion of rand addr inv 2003. With respect to the inverse $GF(2^{12})$ rotation, an example of this is illustrated with respect to FIGS. 23-25, which provide an explicit example of an inverse operation corresponding to the $GF(2^{12})$ example of FIGS. 15-19.

FIGS. 23-25 provide an example of the inverse to the example of the recursive $GF(2^{12})$ random matrix mask calculation of FIGS. 15, 17, and 18. More specifically, FIG. 23 presents the inverse random $GF(2^{12})$ rotation generator invT12 that is the inverse of T12 example of FIG. 15, so that invT12 reverses the operation of T12: invT12*T12=1, where 1 is the 12×12 identity matrix. FIG. 24 corresponds to FIG. 17 and is presented in the same format, but is now for an arbitrary 12×12 input matrix I12 multiplied by the inverse matrix invT12: invo144=I12*invT12 in an [in, out] notation. FIG. 25 illustrates the example of the random inverse rotation matrix invT12 after 37 clock cycles, $(invT12)^{37}$, corresponding to the inverse of T37=(T12) 37 of FIG. 18: given the randomly rotated b12*T37 as input, the matrix of FIG. 25 will return the original b12.

FIG. 26 is a flowchart illustrating an embodiment of secure wear levelling operations for a non-volatile memory. Beginning at step 2601, a logical address is received from a host and can be buffered in the FIFO 1401 in the embodiment of FIG. 14. In the example used above, the address is split into two parts based on the structure of the memory for the embodiment of FIG. 13, with a 24 bit logical address having a 12 bit block address and a 12 bit line address. At step 2603, the logical address is separated into these two parts of a host block address and a host line address. A Galois field based wear levelling is performed on the logical block address at step 2605 by the Log[B] LUT 1403, where the order of the Galois field used is based on the size of the address, which is in turn based on memory structure. In this example, as the block address is 12 bits, $GF(2^{12})$ is used, where this can be implemented by multiply the address vector by matrix for $GF(2^{12})$. At step 2607, a Galois field based wear levelling is performed on the logical line address by the Log[L] LUT 1405, where the order of the Galois field used is based on the size of the address, which is in turn based on memory structure. In this example, as the logical line address is also 12 bits, $GF(2^{12})$ is used. If the wear levelling of the one part of the address affects the other part of the address, as is the case for embodiment of FIG. 14 using the memory structure FIG. 13 where the change to the logical block address effects the logical line address, this will also need to be accounted for adjusting the wear levelled line address, as is done in FIG. 14 by index comparator 1411 based on the word line indices in SRAM 1407. The embodiment also includes an optional start gap scheme 1413 to shift word line values to generate the line index.

The embodiment of FIG. 14 also includes an optional random rotation of the addresses at step 2609 for both block address and the line address, again based on $GF(2^{12})$ for the 12 bit addresses. In FIG. 14, these occur in blocks 1421 and 1415 and are described more detail in FIGS. 20-22, with examples of the rotation matrices discussed with respect to FIGS. 15-19, and where FIGS. 20-22 include both the block address and line address components. Once the random rotations are performed, step 2611 performs the logical to physical conversion of addresses for a combined encryption/wear levelling operation with LUT 1423 for the block address and LUT 1417 for the line address, which respectively correspond to LUTs 2119 and 2129 in block diagram of FIG. 21.

The physical addresses can then be buffered in FIFO 1431 and transmitted to a memory module 1450 at step 2613. Once at the memory module 1450, the random rotation is inverted at step 2615. In FIG. 14, this is done for the block/line address using LUT 1452/1453 and inverse (relative to that at step 2609) $GF(2^{12})$ rotation 1454/1455 and FIG. 22 provides more detail of these elements and provides some examples at FIGS. 23-25. Once the random rotations are inverted at step 2615 to undo the combined encryption/wear levelling of step 2611, the addresses can be buffered in FIFO 1457 and then used to access the internal memory structures 1459, such as for a read or write, at step 2617.

As described above, the use of Galois fields for a combined wear level/logical address encryption techniques address security concerns as part of the wear levelling process. To provide security, the logical address to physical address mappings for both lines and blocks use "indirection table" whose size, in a general implementation, would be impractical to store. However, as described particularly with respect to FIGS. 14, 21, and 22 implement the "indirection table" encryption by use of Galois field calculations, using nonlinear substitutions implemented through Galois field look up tables. The requirements for "indirection tables" for logical to physical mapping is that they be "collision free" (i.e., two different logical addresses never be mapped onto the same physical address), a property that needs to be satisfied by the mapping described above, which furthermore are also quantifiably "pseudorandom".

For the example embodiment of a 2 Gb MRAM memory bank, the $GF(2^{12})$ logical to physical line mapping, LA[L]→PA[L], is chosen as "x→$x^{73}$"; and for the $GF(2^{12})$ logical to physical block mapping, [LA[B]→PA[B], is chosen as "x→$x^{577}$", which are both are collision-free. In terms of the degree of resistance to cryptoanalysis attacks, logical to physical mappings can be quantified in terms of the nonlinear "pseudorandom" map parameters of "differential uniformity" and "nonlinearity measure", which respectively quantify their resistance to differential and linear cryptanalysis. For the described combination of the two $GF(2^{12})$ nonlinear maps, the differential uniformity is minimal and the nonlinearity measure is maximal: i.e., they are optimally resilient to memory bus differential/linear cryptanalysis attacks.

According to a first set of aspects, a non-volatile memory system, comprising a control circuit configured to connect to a memory circuit of a plurality of non-volatile memory cells. The control circuit is configured to: receive from a host a multi-bit logical address for accessing the memory circuit; perform a combined address encryption/wear levelling operation on the logical address including multiplying the logical address by an element of a Galois field having an order based on a number of bits of the logical address; generate from the wear levelled logical address a corresponding physical address for the memory circuit; and provide the corresponding physical address to the memory circuit.

In additional aspects, a method includes: receiving at a memory controller a multi-bit logical address for accessing a memory circuit; generating by the memory controller of a corresponding physical address for the memory circuit from the logical address, which includes performing a combined address encryption/wear levelling operation on the logical address by multiplying the logical address by a first element of a first Galois field having an order based on a number of bits of the logical address; and providing by the memory controller of the corresponding physical address to the memory circuit.

In another set of aspects, a non-volatile memory system, comprising a memory circuit comprising one or more memory modules, each memory module comprising one or more sub-arrays of non-volatile memory cells and a memory controller connected to the memory circuit. The memory controller is configured to: receive a multi-bit logical address for accessing the memory circuit; perform a combined address encryption/wear levelling operation on the logical address including multiplying the logical address by a first element of a first Galois field having an order based on a number of bits of the logical address; generate from the wear levelled logical address a corresponding physical address for the memory circuit; transmit the corresponding physical address to the memory circuit; and access the memory cells of the memory circuit at the corresponding physical address.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory system, comprising:
a control circuit configured to connect to a memory circuit comprising a plurality of non-volatile memory cells, the control circuit configured to:
receive from a host a multi-bit logical address for accessing the memory circuit;
perform a combined address encryption/wear levelling operation on the logical address including multiplying the logical address by a first element of a first Galois field having an order based on a number of bits of the logical address;
perform a randomly generated rotation on the wear levelled logical address;
generate from the rotated wear levelled logical address a corresponding physical address for the memory circuit; and
provide the corresponding physical address to the memory circuit; and
the memory circuit, wherein the memory circuit is configured to:
receive the corresponding physical address;
invert the randomly generated rotation; and
subsequent to inverting the randomly generated rotation, access the non-volatile memory cells at the corresponding physical address.

2. The non-volatile memory system of claim 1, wherein the logical address includes N bits and the order of the first Galois field is $2^N$.

3. The non-volatile memory system of claim 1,
wherein the memory circuit is a magnetoresistive random access memory (MRAM) memory device.

4. The non-volatile memory system of claim 1, wherein the logical address for accessing the memory circuit is a write operation and the control circuit is further configured to:
receive from the host write data corresponding to the logical address;
generate corresponding check bit data from the host write data; and
provide the host write data and the corresponding check bit data to the memory circuit.

5. The non-volatile memory system of claim 1, further comprising:
the memory circuit, wherein the memory circuit is configured to:
receive the write data and the corresponding check bit data; and
write the host write data and the corresponding check bit data into memory cells of the memory circuit.

6. The non-volatile memory system of claim 1, wherein at least a portion of the control circuit is formed on a control die and the memory circuit is on a memory die separate from and bonded to the control die.

7. A non-volatile memory system, comprising:
a control circuit configured to connect to a memory circuit comprising a plurality of non-volatile memory cells, the control circuit configured to:
receive from a host a multi-bit logical address for accessing the memory circuit;
perform a combined address encryption/wear levelling operation on the logical address including multiplying the logical address by a first element of a first Galois field having an order based on a number of bits of the logical address;
perform a randomly generated rotation on the wear levelled logical address performed using the first Galois field;
generate from the rotated wear levelled logical address a corresponding physical address for the memory circuit; and
provide the corresponding physical address to the memory circuit,
wherein to perform the randomly generated rotation on the wear levelled logical address, the control circuit is further configured to:
receive a random input value;
multiple the random input value with a generator of the first Galois field raised to a power of a clock value to generate a rotation matrix; and multiply the wear levelled logical address by the rotation matrix.

8. The non-volatile memory system of claim 7, wherein the logical address includes N bits and the order of the first Galois field is $2^N$.

9. The non-volatile memory system of claim 7, further comprising:
the memory circuit, wherein the memory circuit is a magnetoresistive random access memory (MRAM) memory device.

10. The non-volatile memory system of claim 9, wherein at least a portion of the control circuit is formed on a control die and the memory circuit is on a memory die separate from and bonded to the control die.

11. The non-volatile memory system of claim 7, wherein the logical address for accessing the memory circuit is a write operation and the control circuit is further configured to:
receive from the host write data corresponding to the logical address;
generate corresponding check bit data from the host write data; and
provide the host write data and the corresponding check bit data to the memory circuit.

12. The non-volatile memory system of claim 11, further comprising:
the memory circuit, wherein the memory circuit is configured to:
receive the write data and the corresponding check bit data; and
write the host write data and the corresponding check bit data into memory cells of the memory circuit.

13. A method, comprising:
receiving, from a host at a control circuit configured to connect to a memory circuit comprising a plurality of non-volatile memory cells, a multi-bit logical address for accessing the memory circuit, the multi-bit logical address including a first multi-bit part and a second multi-bit part;
performing a combined address encryption/wear levelling operation on the logical address including multiplying the logical address by a first element of a first Galois field having an order based on a number of bits of the logical address, including:
multiplying the first part of the logical address by the first element of the first Galois field which has an order based on a number of bits of the first part of the logical address; and
multiplying the second part of the logical address by a first element of a second Galois field which has an order based on a number of bits of the second part of the logical address;
generating from the wear levelled logical address a corresponding physical address for the memory circuit;
providing the corresponding physical address to the memory circuit; and
prior to generating a corresponding physical address from the wear levelled logical address, performing a first randomly generated rotation on the wear levelled first part of the logical address and performing a second randomly generated rotation on the wear levelled second part of the logical address.

14. The method of claim 13, wherein the number of bits of the first part of the logical address and the number of bits of the second part of the logical address are both N and the order of the first Galois field and of the second Galois field are both $2^N$.

15. The method of claim 13, wherein the first part of the logical address corresponds to a block address on the memory circuit and the second part of the logical address corresponds to a word line address on the memory circuit.

16. The method of claim 15, wherein performing the combined address encryption/wear levelling operation on the logical address further comprises:
subsequent to multiplying the second part of the logical address by the first element of the second Galois field, adjusting the second part of the logical address to account for multiplying the first part of the logical address by the first element of the first Galois field.

17. The method of claim 13, wherein the memory circuit is a magnetoresistive random access memory (MRAM) memory device.

18. The method of claim 13, wherein the logical address for accessing the memory circuit is a write operation and the method further comprises:
receiving from a host write data corresponding to the logical address;
generating corresponding check bit data from the host write data; and
providing the host write data and the corresponding check bit data to the memory circuit.

19. The method of claim 18, further comprising:
receiving the host write data and the corresponding check bit data; and
writing the host write data and the corresponding check bit data into memory cells of the memory circuit.

* * * * *